(12) United States Patent
Fan

(10) Patent No.: US 11,776,813 B2
(45) Date of Patent: Oct. 3, 2023

(54) METHOD FOR PREPARING SEMICONDUCTOR DEVICE STRUCTURE WITH FINE PATTERNS AT DIFFERENT LEVELS

(71) Applicant: NANYA TECHNOLOGY CORPORATION, New Taipei (TW)

(72) Inventor: Cheng-Hsiang Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 81 days.

(21) Appl. No.: 17/511,042

(22) Filed: Oct. 26, 2021

(65) Prior Publication Data

US 2022/0044932 A1 Feb. 10, 2022

Related U.S. Application Data

(62) Division of application No. 16/811,824, filed on Mar. 6, 2020, now Pat. No. 11,315,786.

(51) Int. Cl.
| | |
|---|---|
| H01L 21/033 | (2006.01) |
| H01L 21/308 | (2006.01) |
| H01L 21/762 | (2006.01) |
| H01L 21/768 | (2006.01) |
| H01L 21/764 | (2006.01) |
| H01L 21/311 | (2006.01) |

(52) U.S. Cl.
CPC ........ H01L 21/0337 (2013.01); H01L 21/308 (2013.01); H01L 21/31144 (2013.01); H01L 21/764 (2013.01); H01L 21/7682 (2013.01); H01L 21/76229 (2013.01); H01L 21/76816 (2013.01); H01L 21/76885 (2013.01); *H01L 2221/1036* (2013.01)

(58) Field of Classification Search
CPC .............. H01L 21/0337; H01L 21/308; H01L 21/31144; H01L 21/76229; H01L 21/764; H01L 21/76816; H01L 21/7682; H01L 21/6885; H01L 21/0335; H01L 21/76802; H01L 21/76877; H01L 2221/1036; H01L 23/528

See application file for complete search history.

(56) References Cited

U.S. PATENT DOCUMENTS

| | | | | |
|---|---|---|---|---|
| 8,105,935 B2* | 1/2012 | Ohara | ............... | H01L 21/76834 438/618 |
| 8,124,525 B1* | 2/2012 | Koburger, III | ...... | H01L 21/7682 257/E21.583 |
| 8,247,291 B2* | 8/2012 | Min | .................. | H01L 21/31144 438/257 |

* cited by examiner

*Primary Examiner* — Dale E Page
*Assistant Examiner* — Quovaunda Jefferson
(74) *Attorney, Agent, or Firm* — Xuan Zhang

(57) ABSTRACT

The present disclosure provides a method for preparing a semiconductor device structure with fine patterns at different levels. The method includes forming a hard mask material over a substrate; etching the hardmask material to form hard mask pillars; forming spacers over sidewall surfaces of the hard mask pillars; etching the hard mask pillars and the target material by using the spacers as a mask to integrally forming a plurality of target structures, a high-level recesses in one of the plurality of target structures and a low-level recess between two target structures; and integrally forming a high-level conductive pattern in the high-level conductive pattern and a low-level conductive pattern in the low-level recess.

11 Claims, 25 Drawing Sheets

METHOD FOR PREPARING SEMICONDUCTOR DEVICE STRUCTURE WITH FINE PATTERNS AT DIFFERENT LEVELS

CROSS-REFERENCE TO RELATED APPLICATION

This application is a divisional application of U.S. Non-Provisional application Ser. No. 16/811,824 filed Mar. 6, 2020, which is incorporated herein by reference in its entirety.

TECHNICAL FIELD

The present disclosure relates to a method for preparing a semiconductor device structure with fine patterns, and more particularly, to a method for preparing a semiconductor device structure with fine patterns at different levels.

DISCUSSION OF THE BACKGROUND

As semiconductor device structures become smaller and more highly integrated, a number of technologies for fabricating fine patterns for semiconductor device structures have been developed. Particularly, photolithography processes are typically used to fabricate electronic and optoelectronic devices on a substrate, and photoresist patterns prepared by the photolithography processes are used as masks in etching or ion implantation processes. As the required pitch size and critical dimension (CD) continue to shrink, the fineness of the photoresist patterns becomes a very important factor in determining the degree of integration. However, photolithographic processes for fabricating semiconductor features have presented a limitation in the increase of resolution of the exposure apparatus.

Although existing semiconductor device structures with fine patterns and methods for manufacturing the same have been adequate for their intended purposes, they have not been entirely satisfactory in all respects. Therefore, to date, there are still some problems to be overcome in regards to the technologies of forming semiconductor device structures with fine patterns using photolithography processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure comprises: a substrate; a first target structure disposed over the substrate, wherein the first target structure comprises a first portion, a second portion, and a third portion connected to the first portion and the second portion, a height of the first portion and a height of the second portion are greater than a height of the third portion; a second target structure disposed over the target layer, wherein the second target structure comprises a fourth portion, a fifth portion, and a sixth portion connected to the fourth portion and the fifth portion; a low-level conductive pattern positioned between the first target structure and the second target structure; and a high-level conductive pattern positioned in the first target structure.

In some embodiments, the low-level conductive pattern has a first top end and first bottom end, the high-level conductive pattern has a second top end and second bottom end, the first bottom end is lower than the second bottom end, and the first top end and the second top end are substantially at the same level.

In some embodiments, the semiconductor device structure further comprises a first tall air gap between the first target structure and the low-level conductive pattern, and a second tall air gap between the second target structure and the low-level conductive pattern.

In some embodiments, the first tall air gap and the second tall air gap have spacer profiles in a cross-sectional view.

In some embodiments, the first tall air gap and the second tall air gap are substantially symmetric with respect to a middle line between the first target structure and the second target structure.

In some embodiments, the semiconductor device structure further comprises a third tall air gap, wherein the first tall air gap is positioned on a sidewall of the second portion, and the third tall air gap is positioned on a sidewall of the first portion.

In some embodiments, the first tall air gap and the third tall air gap are substantially symmetric with respect to a middle line between the first portion and the second portion.

In some embodiments, the semiconductor device structure further comprises a first tall dielectric spacer positioned between the first tall air gap and the low-level conductive pattern, and a second tall dielectric spacer positioned between the second tall air gap and the low-level conductive pattern.

In some embodiments, the semiconductor device structure further comprises a first short air gap and a first short dielectric spacer positioned between the first tall air gap and the high-level conductive pattern.

In some embodiments, the semiconductor device structure further comprises a first short air gap and a second short air gap positioned at two sides of the high-level conductive pattern.

In some embodiments, the first short air gap and the second short air gap are substantially symmetric with respect to a middle line between the first portion and the second portion.

The semiconductor device structure of claim 1, wherein the high-level conductive pattern is positioned between the first portion and the second portion.

In some embodiments, the semiconductor device structure further comprises a tall air gap positioned between the low-level conductive pattern and the second portion, and a short air gap positioned between the high-level conductive pattern and the second portion.

In some embodiments, the tall air gap and the short air gap have spacer profiles in a cross-sectional view.

In some embodiments, the first portion and the second portion are substantially symmetric with respect to a middle line between the first portion and the second portion.

In another embodiment of the present disclosure, a method for preparing a semiconductor device structure is provided. The method comprises: forming a hard mask material over a substrate; etching the hard mask material to form hard mask pillars; forming spacers over sidewall surfaces of the hard mask pillars; etching the hard mask pillars and the target material by using the spacers as a mask to integrally forming a plurality of target structures, a high-level recesses in one of the plurality of target structures and a low-level recess between two target structures; and integrally forming a high-level conductive pattern in the high-level conductive pattern and a low-level conductive pattern in the low-level recess.

In some embodiments, at least one of the target structure comprises a first portion, a second portion, and a third portion connected to the first portion and the second portion, and the method further comprises: forming a tall air gap between the low-level conductive pattern and the second portion, and a short air gap between the high-level conductive pattern and the second portion.

In some embodiments, the tall air gap and the short air gap have spacer profiles in a cross-sectional view.

In some embodiments, the method further comprises: forming a first tall dielectric spacer between the tall air gap and the low-level conductive pattern, and a second tall dielectric spacer between the short air gap and the high-level conductive pattern.

In some embodiments, at least one of the target structure comprises a first portion, a second portion, and a third portion connected to the first portion and the second portion, and the method further comprises: forming a tall dielectric spacer between the low-level conductive pattern and the second portion, and a short dielectric spacer between the high-level conductive pattern and the second portion.

Embodiments of a semiconductor device structure and methods for preparing the same are provided. The method for preparing the semiconductor device structure may include undercutting a photoresist pattern over a semiconductor substrate, and forming an inner spacer element over a sidewall surface of the photoresist pattern. The inner spacer element has a portion extending into a recess (i.e., the undercut region) of the photoresist pattern to form a footing, and a width of the portion of the inner spacer element increases continuously as the portion extends toward the semiconductor substrate. As a result, the inner spacer element may be prevented from collapsing after removal of the photoresist pattern.

In addition, the bottom ends of the high-level conductive pattern and the low-level conductive pattern are positioned and different level, and there are air gaps between the high-level conductive pattern and the low-level conductive pattern. Thus, the parasitic capacitance between the high-level conductive pattern and the low-level conductive pattern can be effectively reduced. That is to say, an interference effect between electrical signals induced or applied to the high-level conductive pattern and the low-level conductive pattern may be remarkably alleviated by the extended distance between the high-level conductive pattern and the low-level conductive pattern.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
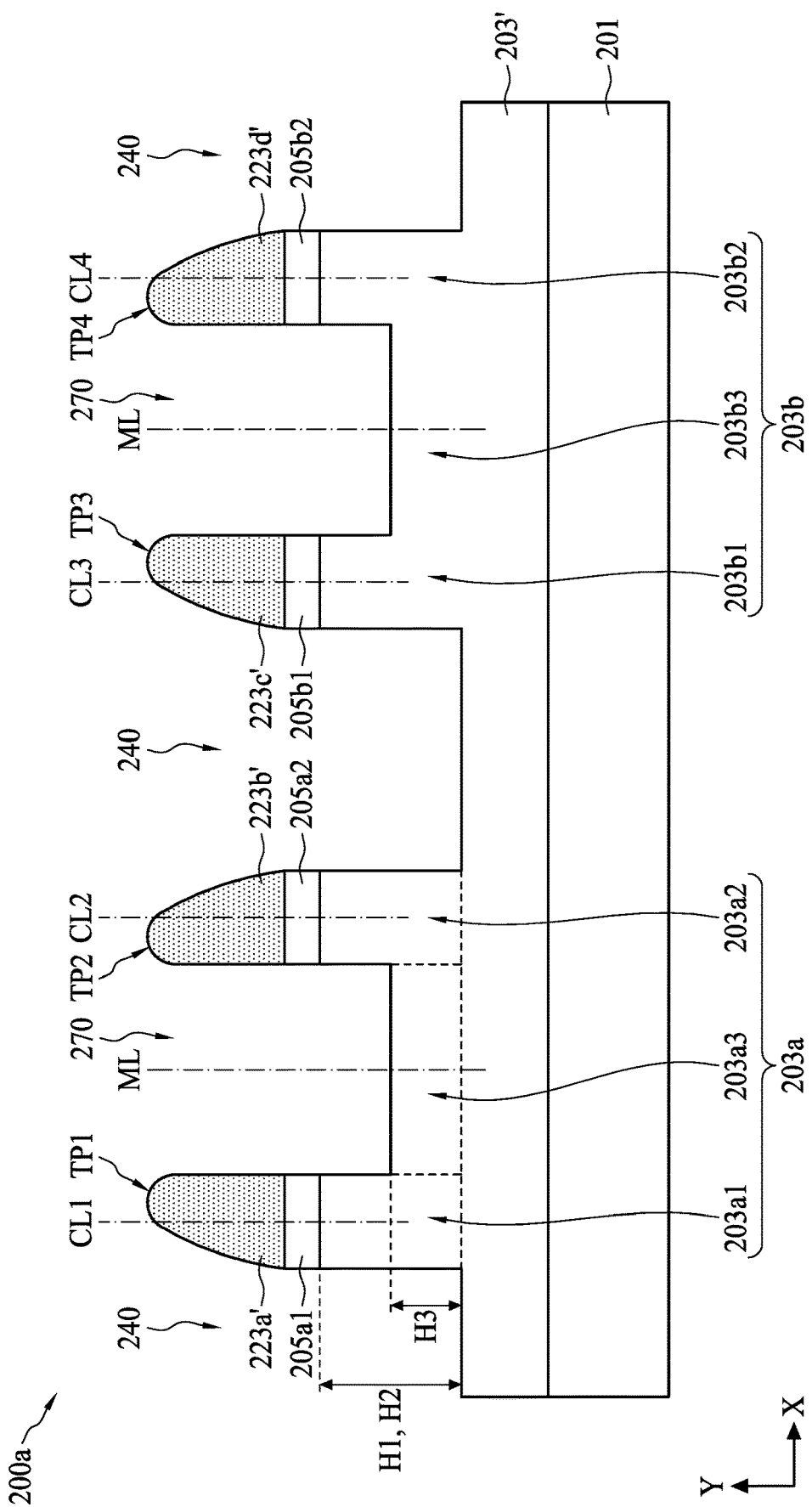
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 200a, in accordance with some embodiments. As shown in FIG. 1, the semiconductor device structure 200a includes a target layer 203' disposed over a semiconductor substrate 201, and target structures 203a and 203b disposed over the target layer 203', in accordance with some embodiments.

No obvious interfaces exist between the target structures 203a and the target layer 203', and between the target structure 203b and the target layer 203'. The dotted lines shown in FIG. 1 are to clarify the disclosure. It should be noted that the target structures 203a and 203b and the target layer 203' are made of the same material, and are formed simultaneously from the same material layer, in accordance with some embodiments.

More specifically, the target structure 203a includes a first portion 203a1, a second portion 203a2, and a third portion 203a3 between the first portion 203a1 and the second portion 203a2. Similarly, the target structure 203b includes a fourth portion 203b1, a fifth portion 203b2, and a sixth portion 203b3 between the fourth portion 203b1 and the fifth portion 203b2.

No obvious interfaces exist between the first portion 203a1 and the third portion 203a3, and between the third portion 203a3 and the second portion 203a2. Similarly, no obvious interfaces exist between the fourth portion 203b1 and the sixth portion 203b3, and between the sixth portion 203b3 and the fifth portion 203b2. The dotted lines shown in FIG. 1 are to clarify the disclosure.

In the target structure 203a, the first portion 203a1 has a height H1 along the Y-direction, the second portion 203a2 has a height H2 along the Y-direction, and the third portion 203a3 has a height H3 along the Y-direction. In some embodiments, the first height H1 is substantially the same as the height H2, and the height H3 is greater than both the heights H1 and H2. Within the context of this disclosure, the word "substantially" means preferably at least 90%, more preferably 95%, even more preferably 98%, and most preferably 99%. In some embodiments, the first portion 203a1, the second portion 203a2 and the third portion 203a3 form a U-shaped structure.

The features of the target structure 203b may be similar to the abovementioned features of the target structure 203a and descriptions thereof are not repeated herein. For example, the fourth portion 203b1, the fifth portion 203b2 and the sixth portion 203b3 form another U-shaped structure, in accordance with some embodiments.

In some embodiments, the semiconductor device structure 200a also includes a hard mask structure 205a1 disposed over the first portion 203a1 of the target structure 203a, a hard mask structure 205a2 disposed over the second portion 203a2 of the target structure 203a, a hard mask structure 205b1 disposed over the fourth portion 203b1 of the target structure 203b, and a hard mask structure 205b2 disposed over the fifth portion 203b2 of the target structure 203b. The hard mask structures 205a1, 205a2, 205b1 and 205b2 are made of the same material, and are formed simultaneously from the same material layer, in accordance with some embodiments.

In some embodiments, the semiconductor device structure 200a further includes a spacer element 223a' disposed over the hard mask structure 205a1, a spacer element 223b' disposed over the hard mask structure 205a2, a spacer element 223c' disposed over the hard mask structure 205b1, and a spacer element 223d' disposed over the hard mask structure 205b2. The spacer elements 223a', 223b', 223c' and 223d' are made of the same material, and are formed simultaneously from the same material layer, in accordance with some embodiments.

Figure 2:
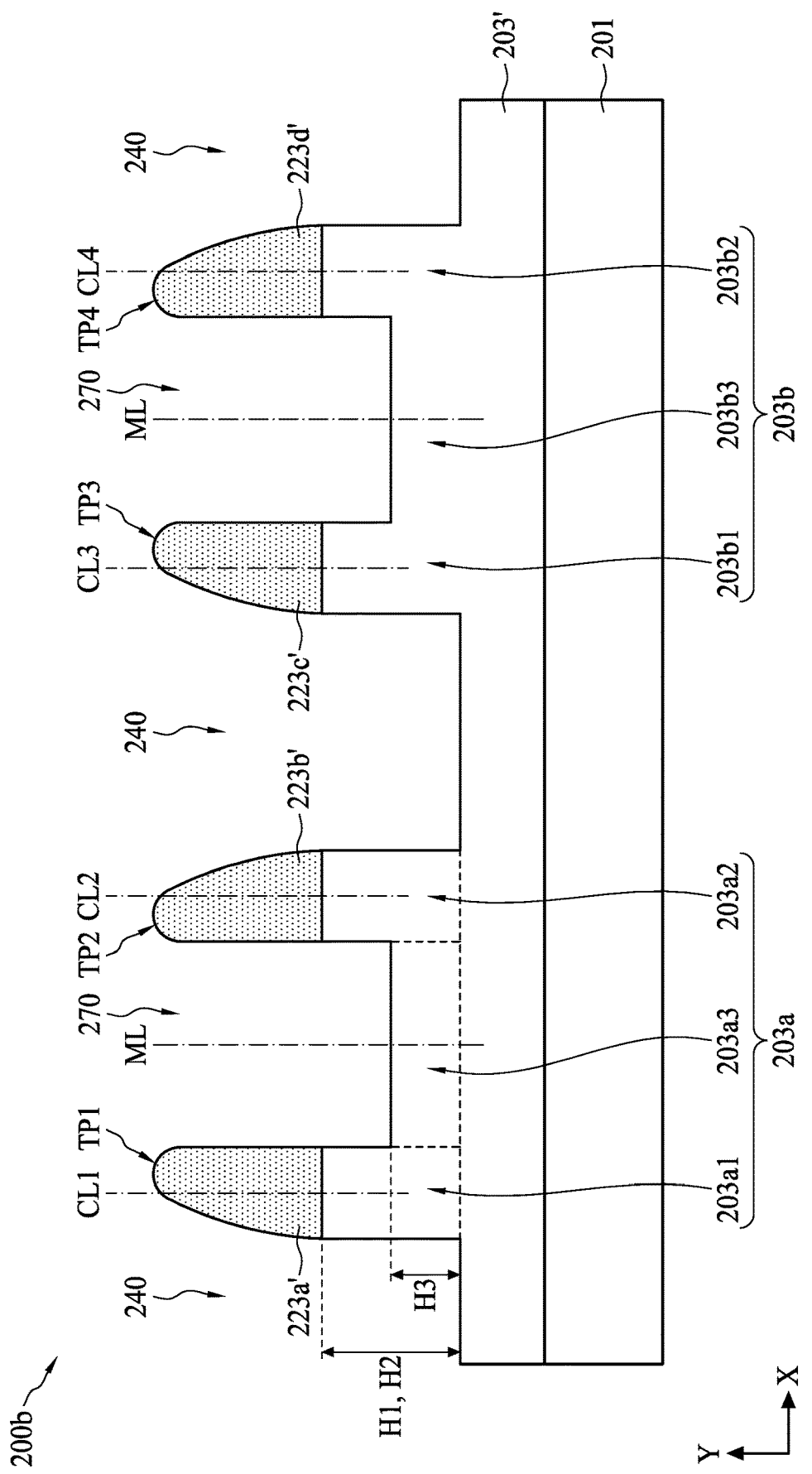
FIG. 2 is a cross-sectional view illustrating a semiconductor device structure, in accordance with some embodiments.

As shown in the cross-sectional view of FIG. 2, the first portion 203a1 of the target structure 203a has a central line CL1, the second portion 203a2 of the target structure 203a has a central line CL2, the fourth portion 203b1 of the target structure 203b has a central line CL3, and the fifth portion 203b2 of the target structure 203b has a central line CL4. Moreover, the spacer element 223a' has a topmost point TP1, the spacer element 223b' has a topmost point TP2, the spacer element 223c' has a topmost point TP3, and the spacer element 223d' has a topmost point TP4.

Specifically, in the cross-sectional view of FIG. 2, the topmost point TP1 of the spacer element 223a' and the topmost point TP2 of the spacer element 223b' are between the central line CL1 and the central line CL2, and the topmost point TP3 of the spacer element 223c' and the topmost point TP4 of the spacer element 223d' are between the central line CL3 and the central line CL4, in accordance with some embodiments.

In some embodiments, the recesses 270 are disposed over the target structures 203a and 203b, and recesses 240 are formed between adjacent target structures (e.g., between the target structures 203a and 203b). In some embodiments, the spacer elements 223a' and 223b' are separated by one of the recesses 270, the spacer elements 223c' and 223d' are separated by the other recess 270, and the spacer elements 223b' and 223c' are separated by one of the recesses 240. It should be noted that the recesses 240 are deeper than the recesses 270 (i.e., extending to a lower level in the Y-direction), in accordance with some embodiments.

FIG. 2 is a cross-sectional view illustrating a semiconductor device structure 200b, which is an alternative embodiment of the semiconductor device structure 200a, in accordance with some embodiments. For consistency and clarity, similar components appearing in both FIGS. 1 and 2 are labeled the same. One difference between the embodiment shown in FIG. 1 and the embodiment shown in FIG. 2 is that the hard mask structures 205a1, 205a2, 205b1 and 205b2 are not formed in the embodiment shown in FIG. 2.

Figure 3:
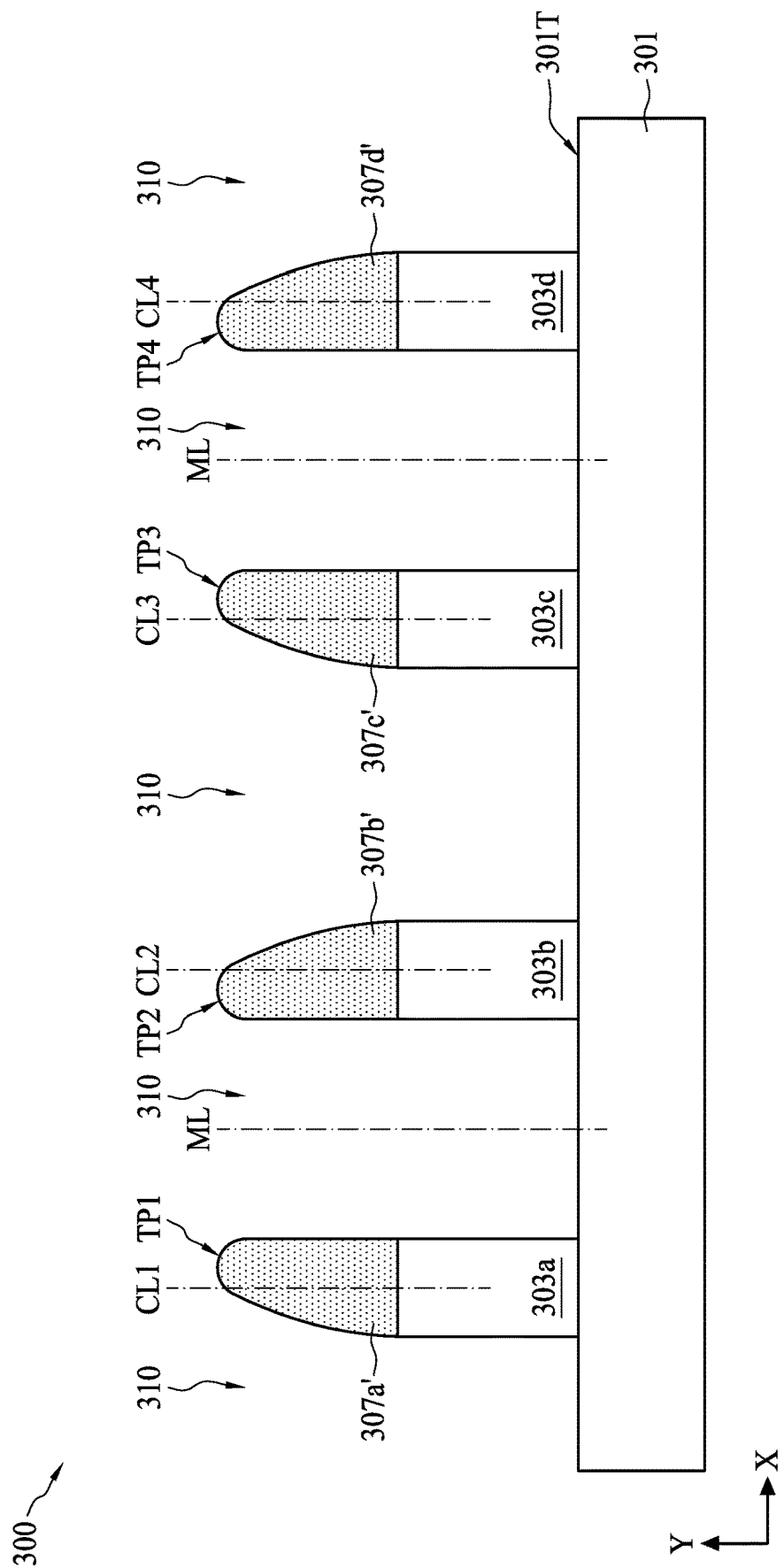
FIG. 3 is a cross-sectional view illustrating a semiconductor device structure, in accordance with some embodiments.

FIG. 3 is a cross-sectional view illustrating a semiconductor device structure 300, in accordance with some embodiments. As shown in FIG. 3, the semiconductor device structure 300 includes target structures 303a, 303b, 303c and 303d disposed over a semiconductor substrate 301, and spacer elements 307a', 307b', 307c' and 307d' disposed over the target structures 303a, 303b, 303c and 303d, in accordance with some embodiments.

In some embodiments, the spacer element 307a' is disposed over the target structure 303a, the spacer element 307b' is disposed over the target structure 303b, the spacer element 307c' is disposed over the target structure 303c, and the spacer element 307d' is disposed over the target structure 303d. Moreover, in some embodiments, each adjacent pair of the spacer elements 307a', 307b', 307c' and 307d' is separated by an opening 310. In some embodiments, each adjacent pair of the adjacent target structures 303a, 303b, 303c and 303d is separated by one of the openings 310 such that a top surface 301T of the semiconductor substrate 301 is exposed in the opening 310.

As shown in FIG. 3, the target structure 303a has a central line CL1, the target structure 303b has a central line CL2, the target structure 303c has a central line CL3, and the target structure 303d has a central line CL4. Moreover, the spacer element 307a' has a topmost point TP1, the spacer element 307b' has a topmost point TP2, the spacer element 307c' has a topmost point TP3, and the spacer element 307d' has a topmost point TP4.

In some embodiments, as shown in FIG. 3, the topmost point TP1 of the spacer element 307a' and the topmost point TP2 of the spacer element 307b' are between the central line CL1 and the central line CL2, and the topmost point TP3 of the spacer element 307c' and the topmost point TP4 of the spacer element 307d' are between the central line CL3 and the central line CL4, in accordance with some embodiments.

Figure 4:
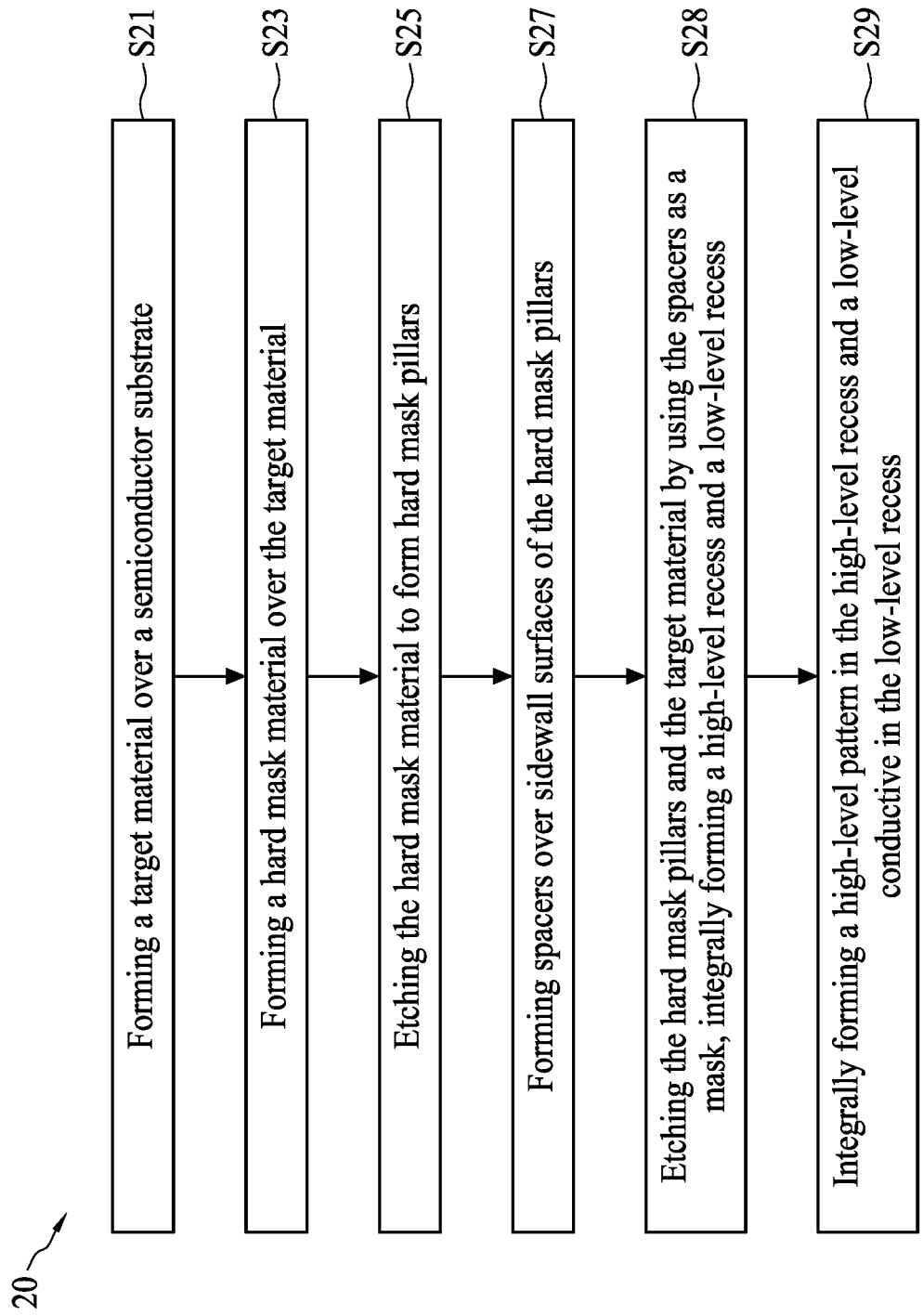
FIG. 4 is a flow diagram illustrating a method of forming a semiconductor device structure, in accordance with some embodiments.

FIG. 4 is a flow diagram illustrating a method 20 of forming a semiconductor device structure (e.g., the semiconductor device structure 200a or 200b), wherein the method 20 includes steps S21, S23, S25, S27, S28 and S29, in accordance with some embodiments.

In accordance with some embodiments, the steps S21 to S29 of FIG. 4 are elaborated in connection with FIGS. 6-17, which are cross-sectional views illustrating sequential intermediate stages in the formation of the semiconductor device structure 200a. In accordance with some other embodiments, the steps S21 to S29 of FIG. 4 are elaborated in connection with FIGS. 6-17, which are cross-sectional views illustrating sequential intermediate stages in the formation of the semiconductor device structure 200b.

Figure 6:
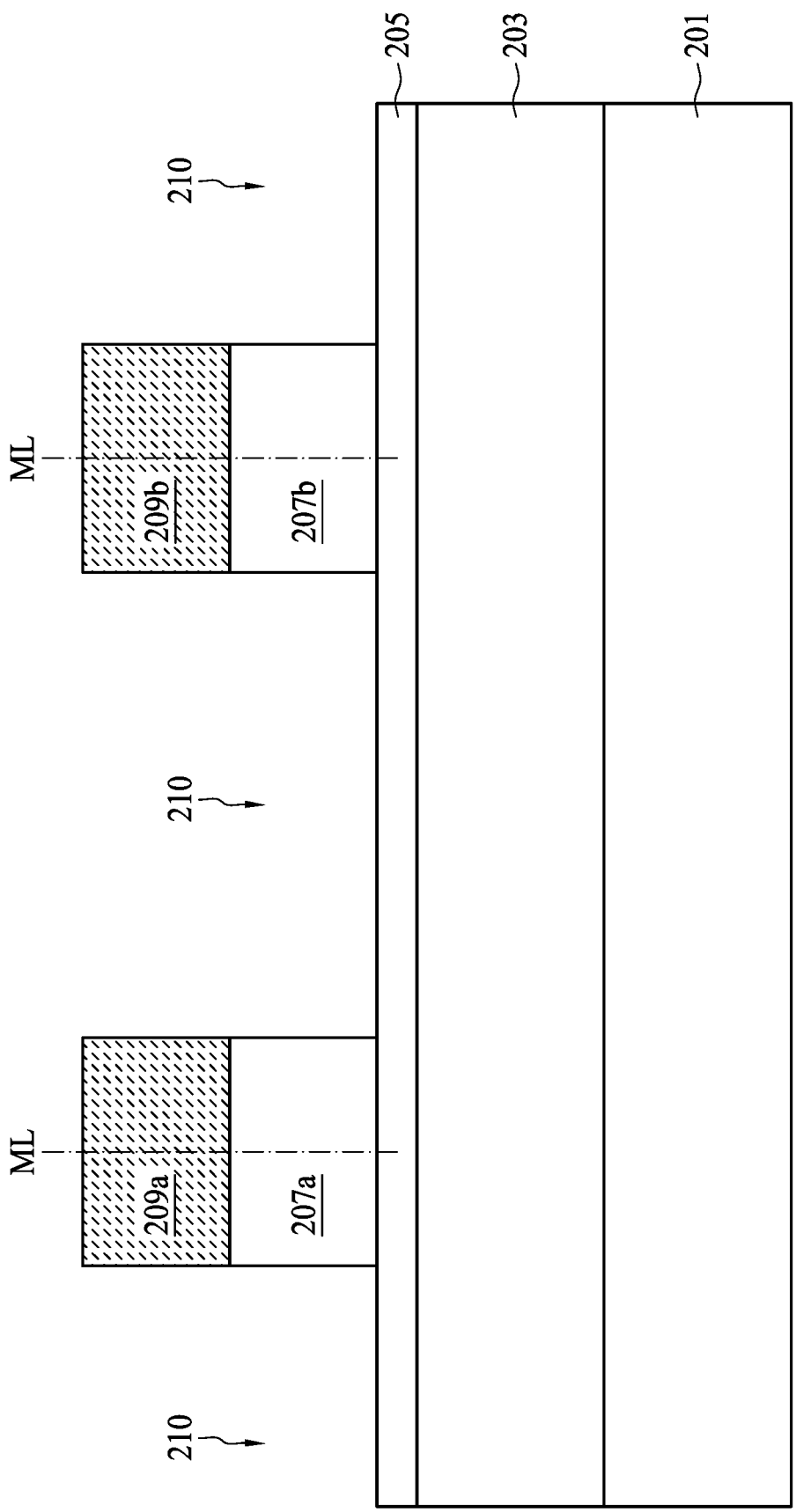
FIG. 6 is a cross-sectional view illustrating an intermediate stage in the formation of hard mask pillars and photoresist patterns over a substrate, in accordance with some embodiments.

As shown in FIG. 6, the semiconductor substrate 201 is provided, and a target material 203 is disposed over the semiconductor substrate 201. The respective step is illustrated as the step S21 in the method 20 shown in FIG. 4. The details of the semiconductor substrate 201 may be similar to or the same as the details of the semiconductor substrate 101, and descriptions thereof are not repeated herein.

In some embodiments, the target material 203 is a dielectric layer. For example, the target material 203 is made of silicon oxide, silicon carbide, silicon nitride, silicon oxynitride, another suitable dielectric material, or a combination thereof. In some embodiments, the target material 203 includes an interconnect structure, which has one or more metallization layers (e.g., copper layers) formed in the target material 203, and the interconnect structure is used to connect various electrical components to form functional circuitry. In some embodiments, the target material 203 is formed by any suitable process, such as deposition, damascene, and/or dual damascene.

Still referring to FIG. 6, a hard mask layer 205 is disposed over the target material 203 and hard mask pillars 207a and 207b are disposed over the hard mask layer 205 by an etching process using photoresist patterns 209a and 209b as a mask, in accordance with some embodiments. In some embodiments, the hard mask layer 205 and the hard mask pillars 207a, 207b are made of dielectric materials, such as silicon oxide, silicon carbide, silicon nitride, silicon oxynitride, one or more suitable materials, or a combination thereof.

In some embodiments, the hard mask layer 205 and the hard mask pillars 207a, 207b are formed by a deposition process and an etching process, in accordance with some embodiments. For example, a hard mask material (not shown) may be conformally deposited over the top surface of the target layer 203, and the photoresist patterns 209a and 209b are disposed over the hard mask material. Some processes used to form the photoresist patterns 209a and 209b are similar to, or the same as, those used to form the photoresist patterns 103 and descriptions thereof are not repeated herein. After the photoresist patterns 209a and 209b are formed, portions of the hard mask material exposed by the photoresist patterns 209a and 209b are removed by a dry etching process to form openings 210 between adjacent hard mask pillars (e.g., the hard mask pillars 207a and 207b), as shown in FIG. 6. The respective steps are illustrated as the steps S23 and S25 in the method 20 shown in FIG. 4.

It should be noted that the target material 203 is not exposed by the openings 210, in accordance with some embodiments. Moreover, the hard mask layer 205 and the hard mask pillars 207a, 207b are made of the same material and are formed simultaneously, in accordance with some embodiments. After the openings 210 are obtained, the photoresist patterns 209a and 209b may be removed.

Figure 7:
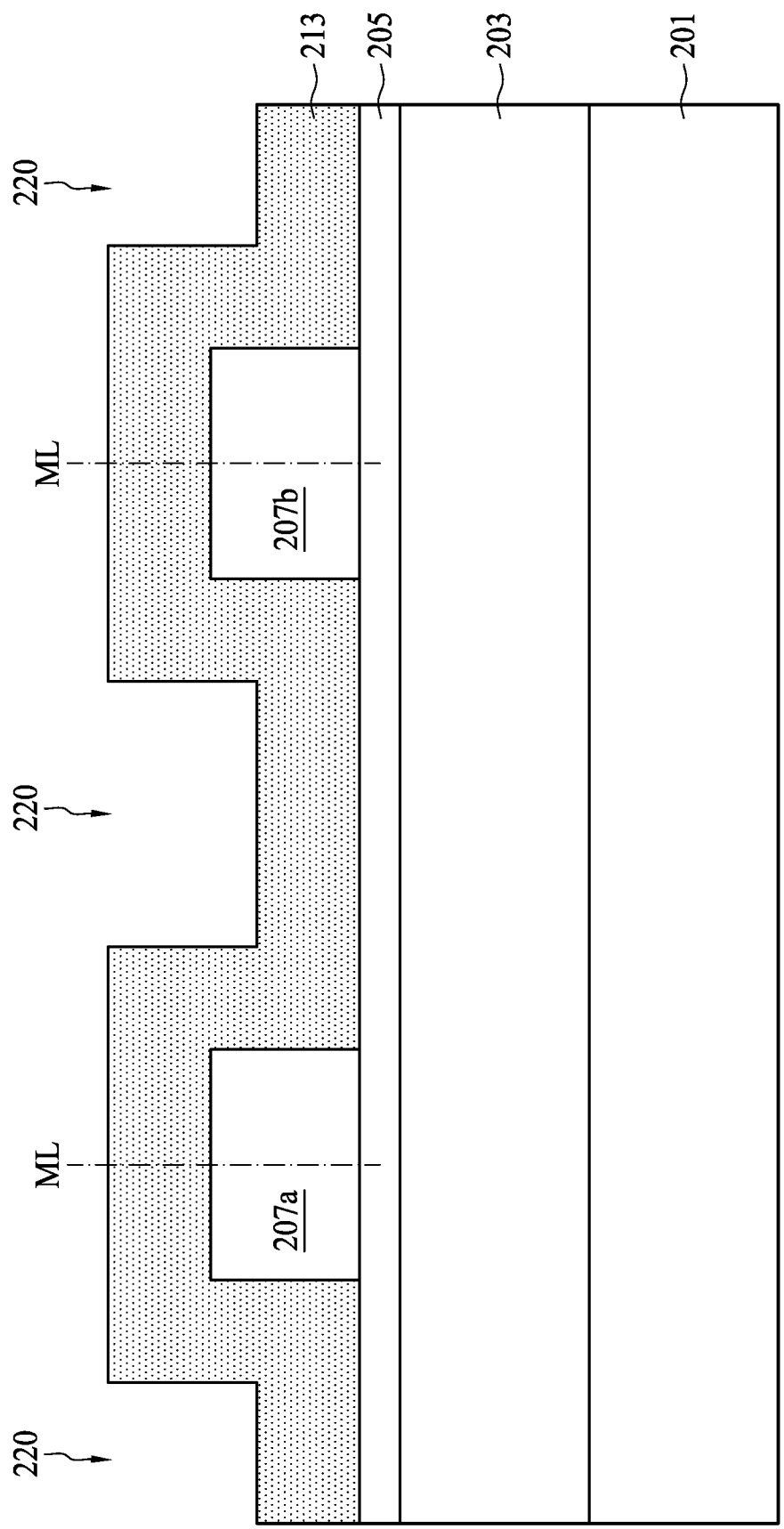
FIG. 7 is a cross-sectional view illustrating an intermediate stage in the formation of a conformal spacer material over the substrate, in accordance with some embodiments.

Referring to FIG. 7, in some embodiments, after the photoresist patterns 209a and 209b are removed, a spacer material 213 is conformally deposited over the top surfaces and the sidewall surfaces of the hard mask pillars 207a, 207b and the top surface of the hard mask layer 205, such that reduced openings 220 are obtained in accordance with some embodiments.

In some embodiments, the spacer material 213 is made of silicon oxide, silicon carbide, silicon nitride, silicon oxynitride, another suitable material, or a combination thereof, and the deposition process for forming the spacer material 213 includes a CVD process, a physical vapor deposition (PVD) process, an atomic layer deposition (ALD) process, a spin-on process, or another suitable process. In some embodiments, the material of the spacer material 213 is different from the material of the hard mask pillars 207a and 207b. It should be noted that the material of the hard mask pillars 207a and 207b has a high etching selectivity against the material of the spacer material 213.

Figure 8:
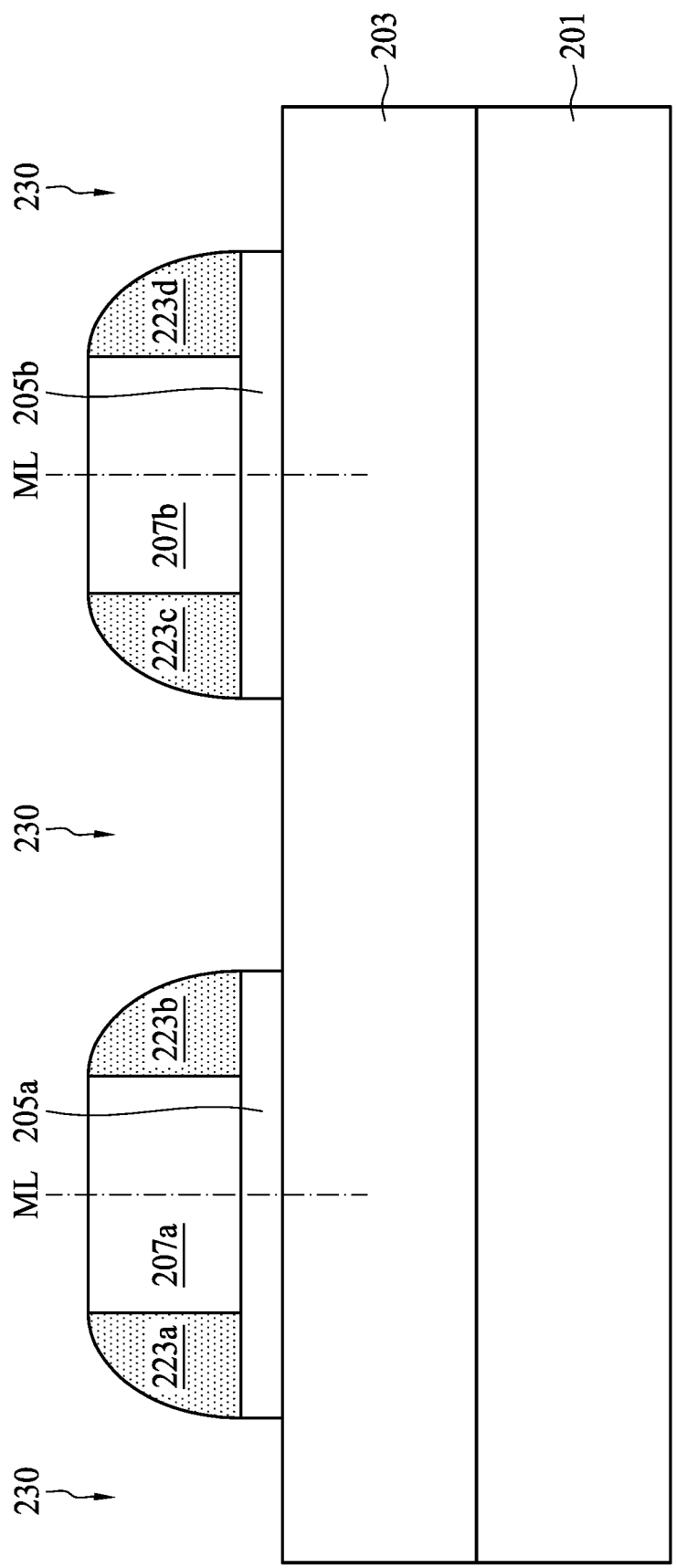
FIG. 8 is a cross-sectional view illustrating an intermediate stage in the formation of a spacer element over the substrate, in accordance with some embodiments.

Referring to FIG. 8, in some embodiments, the spacer material 213 is etched to form spacers 223a, 223b, 223c and 223d over sidewall surfaces of the hard mask pillars 207a, 207b in accordance with some embodiments. The respective steps are illustrated as the step S27 in the method 20 shown in FIG. 4. In some embodiments, the etching process is an anisotropic etching process, which removes the same amount of the spacer material 213 vertically in all places, leaving the spacers 223a, 223b, 223c and 223d over the sidewall surfaces of the hard mask pillars 207a and 207b. In some embodiments, the etching process is a dry etching process.

Moreover, portions of the hard mask layer 205 between the hard mask pillars 207a and 207b are removed to form hard mask portions 205a and 205b, and openings 230 are obtained between adjacent hard mask portions (e.g., hard mask portions 205a and 205b), as shown in FIG. 8 in accordance with some embodiments. In some embodiments, the target material 203 is exposed by the openings 230. In some embodiments, the spacers 223a, 223b, 223c and 223d are separated from the target material 203 by the hard mask portions 205a and 205b.

Figure 9:
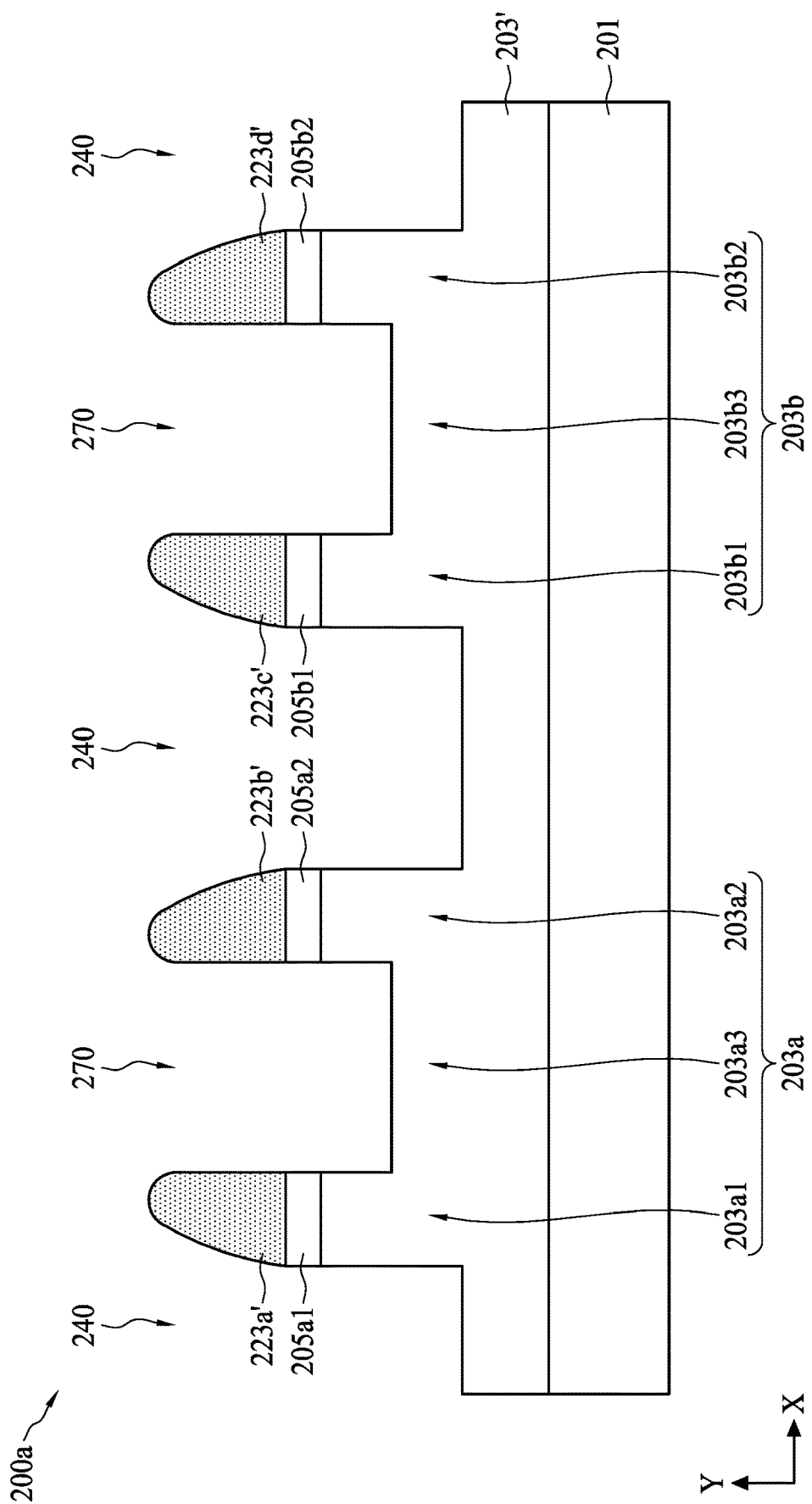
FIG. 9 is a cross-sectional view illustrating an intermediate stage in the formation of plurality of recesses over the substrate, in accordance with some embodiments.

Referring to FIG. 9, in some embodiments, the hard mask pillars 207a, 207b, the hard mask portions 205a, 205b, and the target material 203 are etched using the spacers 223a, 223b, 223c, 223d as a mask, integrally forming a high-level recess (shallow opening) 270 and a low-level recess (deep opening) 240, in accordance with some embodiments. The respective steps are illustrated as the step S29 in the method 20 shown in FIG. 4. In some embodiments, the etching process is a dry etching process.

In some embodiments, the hard mask pillars 207a, 207b are entirely removed, the hard mask structures 205a1, 205a2, 205b1 and 205b2 are formed by etching the hard mask portions 205a, 205b and the target layer 203', and the target structures 203a, 203b are disposed over the target layer 203' by etching the target material 203, in accordance with some embodiments. In addition, the spacers 223a, 223b, 223c and 223d are slightly etched to form spacer elements 223a', 223b', 223c' and 223d'. It should be noted that the material of the hard mask pillars 207a, 207b has a high etching selectivity against the material of the spacers 223a, 223b, 223c, 223d (i.e., the material of the spacer elements 223a', 223b', 223c' and 223d') during the etching process.

The material of the hard mask pillars 207a, 207b has a first etching selectivity against the material of the spacers 223a, 223b, 223c, 223d; the material of the hard mask portions 205a, 205b has a second etching selectivity against the material of the spacers 223a, 223b, 223c, 223d; and the material of the target material 203 has a third etching selectivity against the material of the spacers 223a, 223b, 223c, 223d. In some embodiments, the first etching selectivity, the second etching selectivity and the third etching selectivity are similar to each other.

Since the top surfaces of the hard mask pillars 207a, 207b are higher than the top surface of the target material 203 before the etching process, the low-level recess 240 is deeper than the high-level recesses 270 after the etching process, in accordance with some embodiments. As a result, the spacer elements 223a', 223b', 223c' and 223d' may be prevented from collapsing due to the support provided by the underlying target structures 203a and 203b, which are U-shaped structures protruding from the target layer 203'.

Moreover, because the hard mask pillars 207a, 207b, the hard mask portions 205a, 205b, and the target material 203 have high an etching selectivity against the spacers 223a, 223b, 223c, 223d in the etching process for forming the spacer elements 223a', 223b', 223c', 223d', which may be prevented from collapsing.

Figure 10:
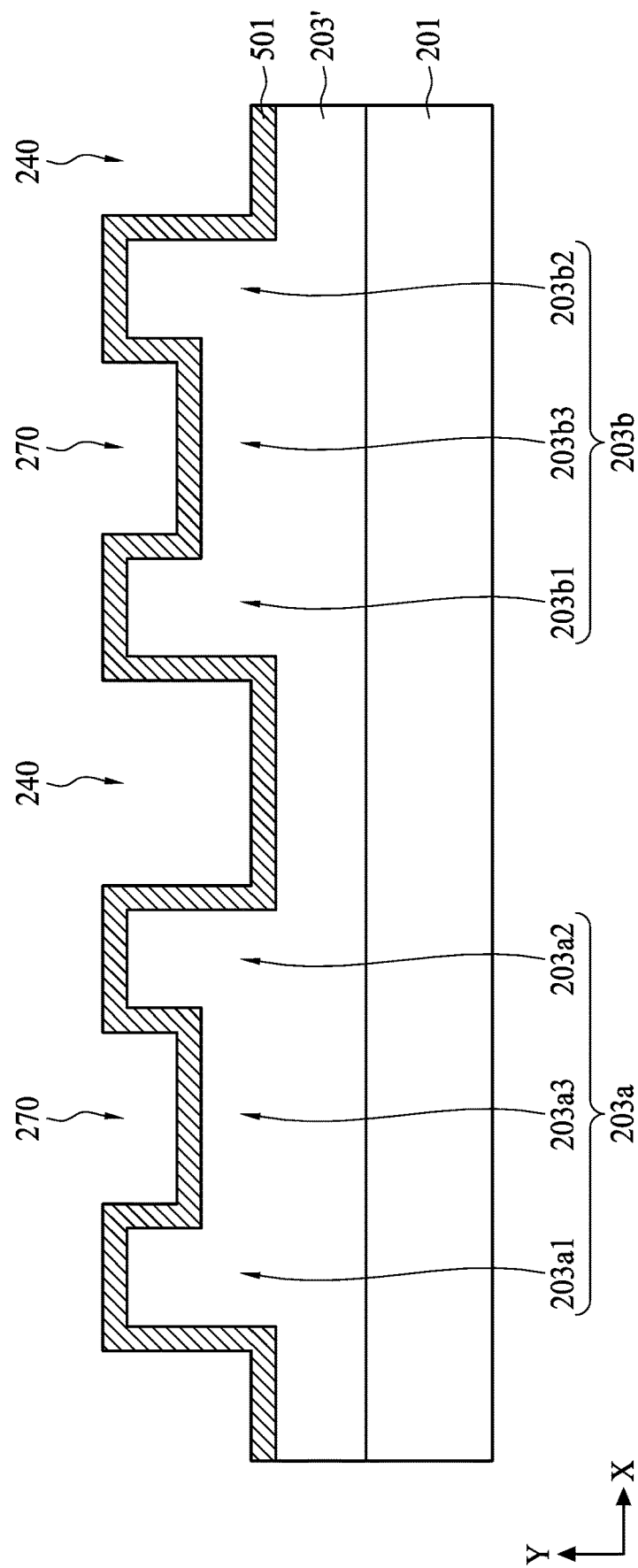
FIG. 10 is a cross-sectional view illustrating an intermediate stage in the formation of a first spacer layer over the substrate, in accordance with some embodiments.

Referring to FIG. 10, in some embodiments, the spacer elements 223a', 223b', 223c', 223d' and the hard mask structures 205a1, 205a2, 205b1, 205b2 are removed, leaving the target layer 203' with the target structures 203a, 203b over the substrate 201. In some embodiments, the high-level recesses 270 are formed over the target structures 203a and 203b, and low-level recesses 240 are formed between adjacent target structures 203a and 203b.

Subsequently, a first spacer layer 501 may be formed to cover t the target structures 203a and 203b. In some embodiments, the first spacer layer 501 may be formed of doped oxide such as borosilica glass, phosphosilica glass, borophosphosilica glass, fluoride silicate glass, carbon doped-silicon oxide, or the like. Alternatively, in another embodiment, the first spacer layer 501 may be formed of a thermal decomposable polymer or a thermal degradable polymer.

Figure 11:
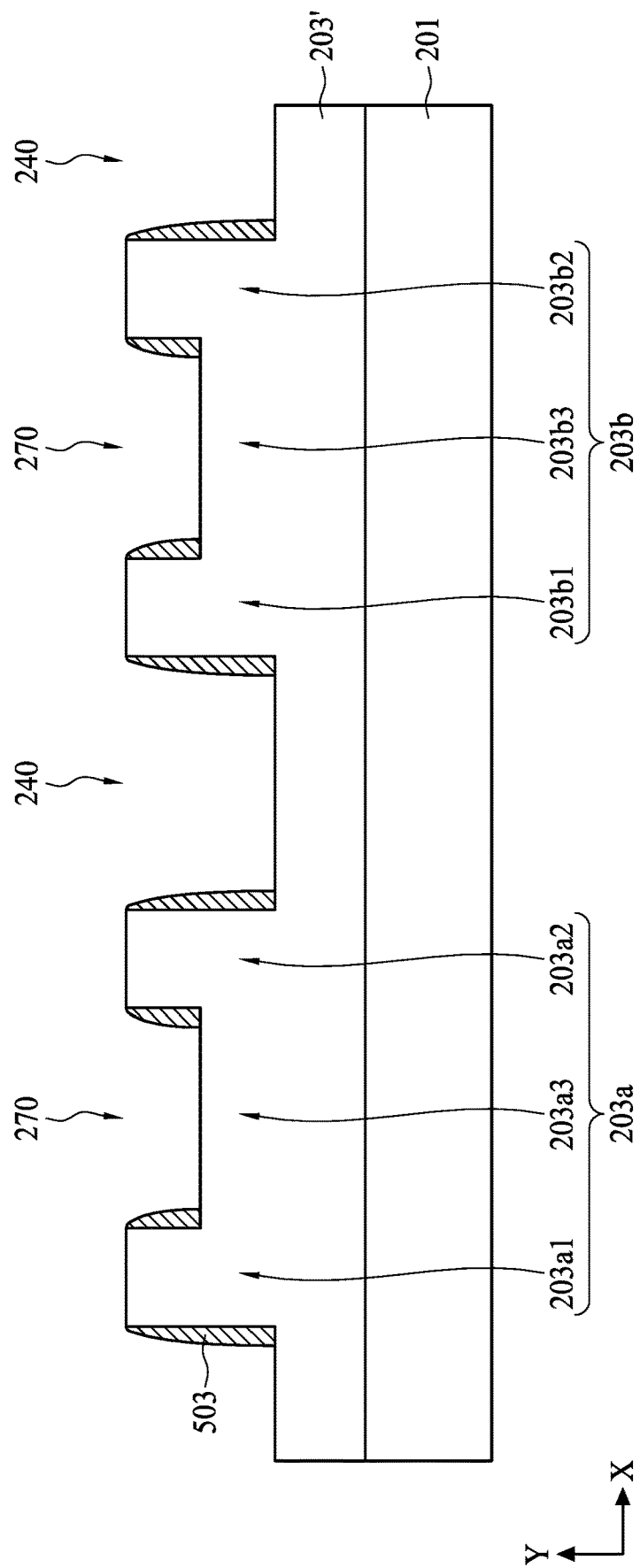
FIG. 11 is a cross-sectional view illustrating an intermediate stage in the formation of a plurality of first spacers over the substrate, in accordance with some embodiments.

Referring to FIG. 11, in some embodiments, an etch process, such as an anisotropic dry etch process, may be performed to form a plurality of first spacers 503 attached to the sidewalls of the first portion 203a1 of the target structure 203a, the sidewalls of the second portion 203a2 of the target structure 203a, the sidewalls of the fourth portion 203b1 of the target structure 203b, and the sidewalls of the fifth portion 203b2 of the target structure 203b.

Figure 12:
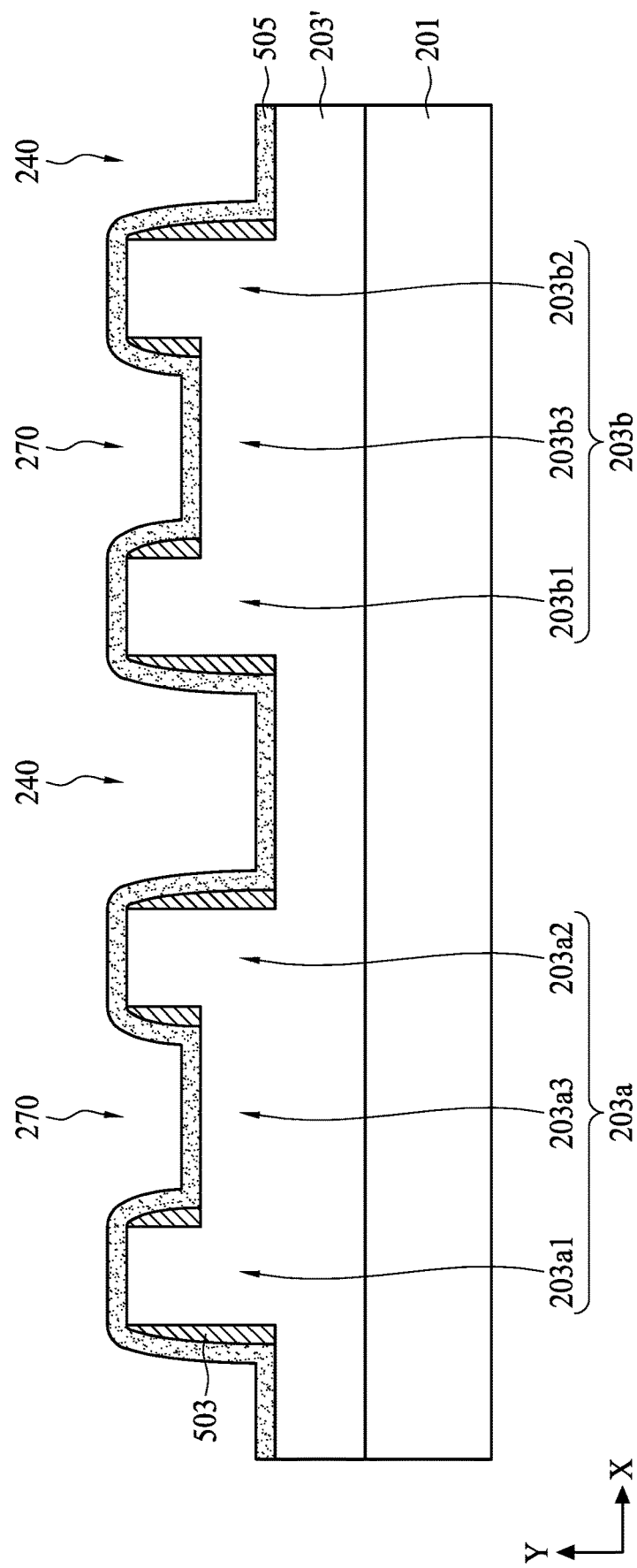
FIG. 12 is a cross-sectional view illustrating an intermediate stage in the formation of a second spacer layer over the substrate, in accordance with some embodiments.

Referring to FIG. 12, in some embodiments, a second spacer layer 505 may be formed to cover the target structures 203a and 203b, and the plurality of first spacers 503. In some embodiments, the second spacer layer 505 may be formed of, for example, silicon nitride.

Figure 13:
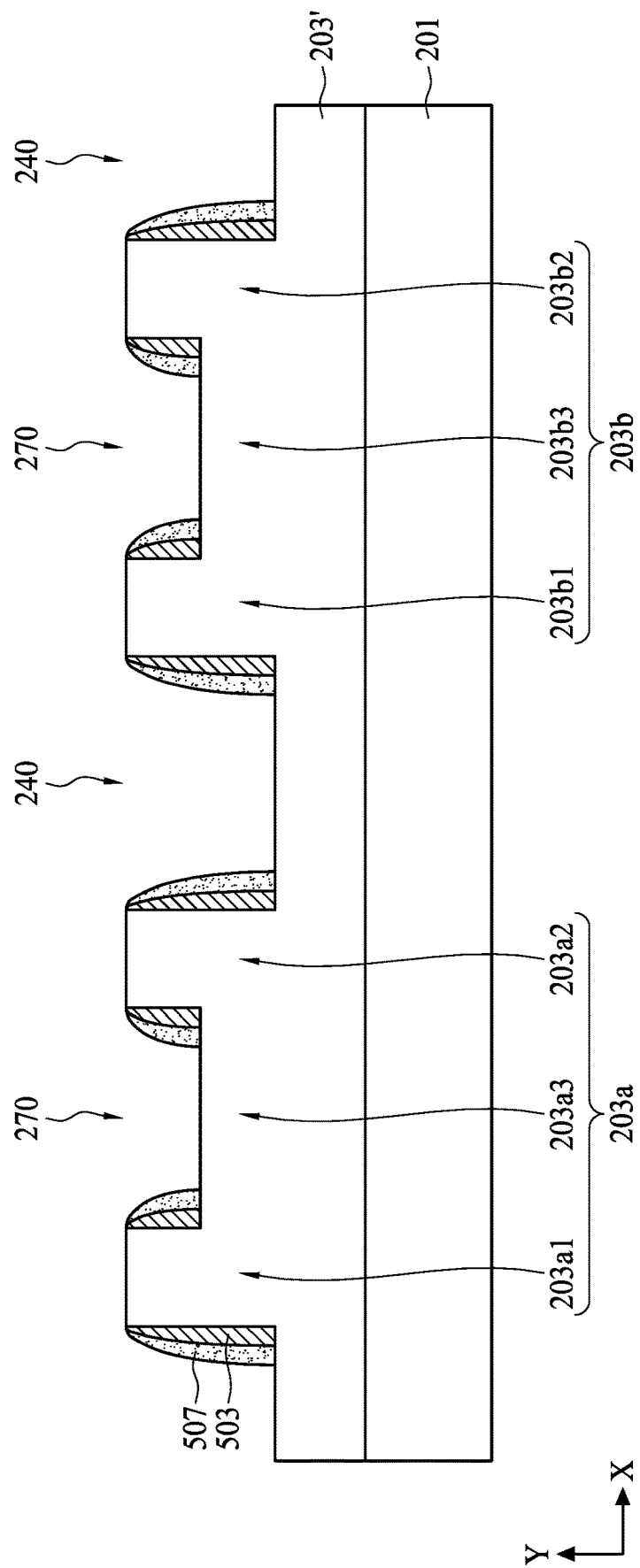
FIG. 13 is a cross-sectional view illustrating an intermediate stage in the formation of a plurality of second spacers over the substrate, in accordance with some embodiments.

Referring to FIG. 13, in some embodiments, an etch process, such as an anisotropic dry etch process, may be performed to form a plurality of second spacers 507 attached to the surfaces of the plurality of first spacers 503.

Figure 14:
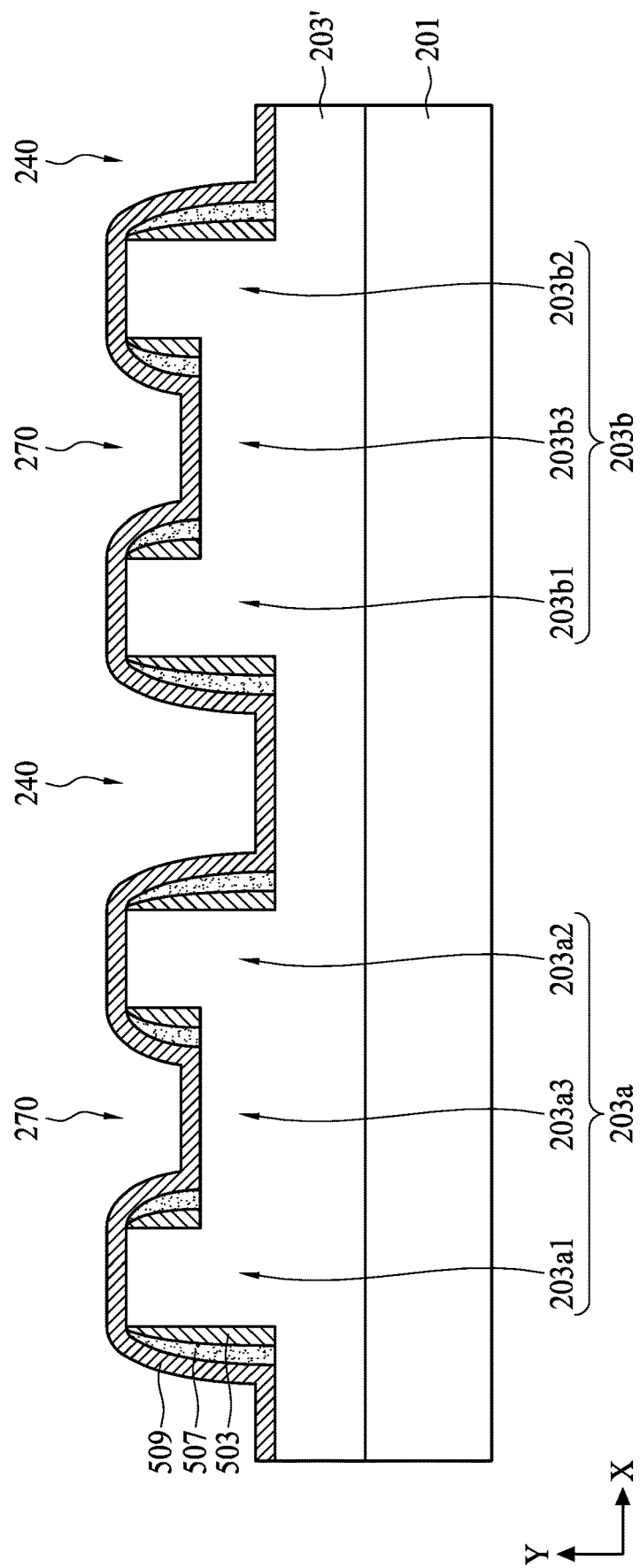
FIG. 14 is a cross-sectional view illustrating an intermediate stage in the formation of a liner layer over the substrate, in accordance with some embodiments.

Referring to FIG. 14, in some embodiments, a liner layer 509 may be formed to cover the target structures 203a and 203b, and the plurality of second spacers 507. In some embodiments, the liner layer 509 may be formed of, for example, titanium, titanium nitride, titanium silicon nitride, tantalum, tantalum nitride, tantalum silicon nitride, or a combination thereof.

Figure 15:
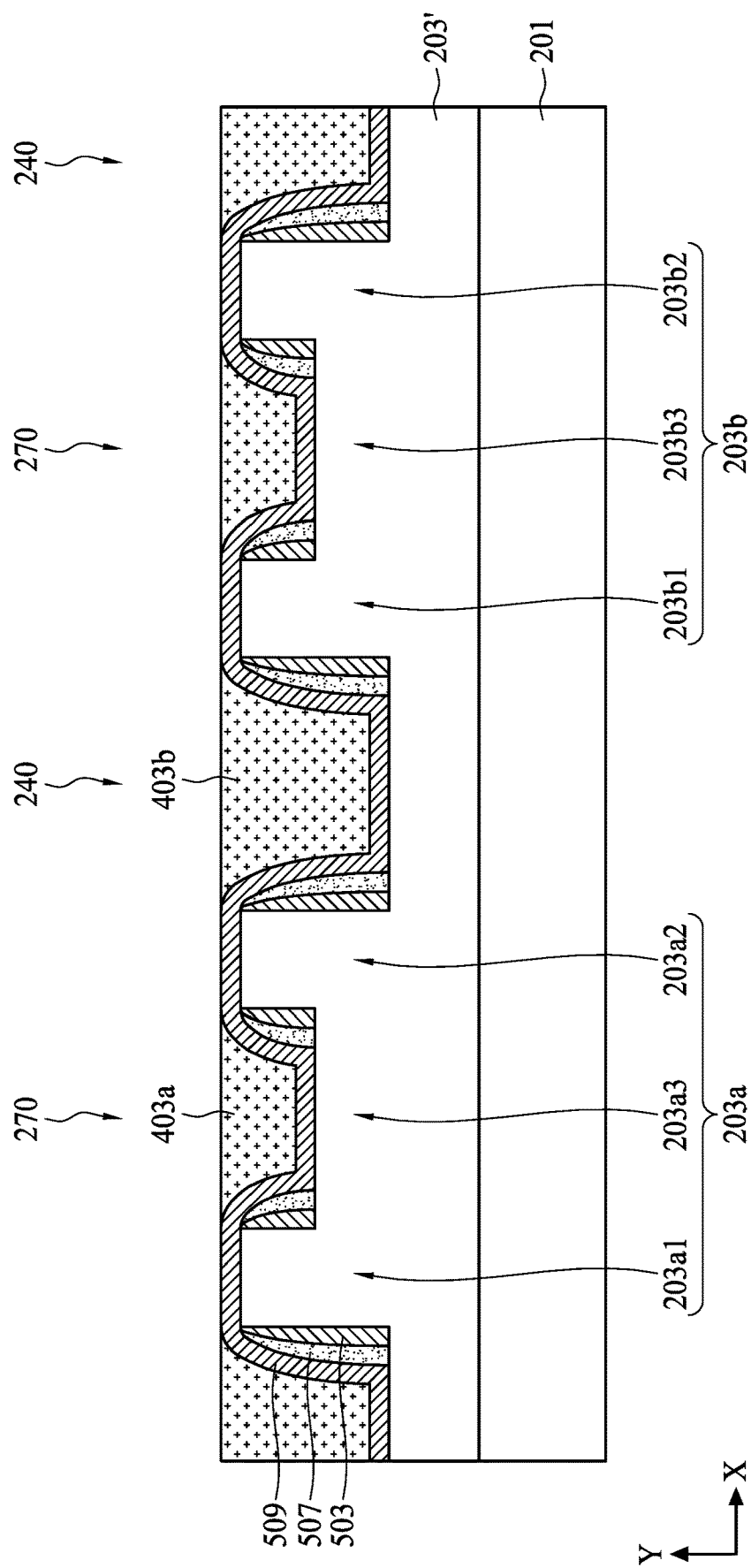
FIG. 15 is a cross-sectional view illustrating an intermediate stage in the formation of a high-level conductive pattern and a low-level conductive pattern over the substrate, in accordance with some embodiments.

Referring to FIG. 15, in some embodiments, a conductive material, for example, doped polysilicon, metal, metal nitride, or metal silicide, may be deposited into the low-level recesses 240 and the high-level recesses 270 by a metallization process. In the embodiment depicted, the conductive material may be tungsten. After the metallization process, a planarization process, such as chemical mechanical polishing, may be performed to remove excess filling material above the liner layer 509, provide a substantially flat surface for subsequent processing steps, and integrally form a high-level conductive pattern 403a in the high-level recess 270 and a low-level conductive pattern 403b in the low-level recess 240. In some embodiments, the high-level conductive pattern 403a and the low-level conductive pattern 403b are conductive patterns serving as conductive contacts having bottom ends at different levels for contacting terminals at different levels.

In some embodiments, the bottom end of the high-level conductive pattern 403a electrically contacts a gate terminal of a planar transistor, and the bottom end of the low-level conductive pattern 403b electrically contacts a source/drain terminal of the planar transistor, wherein the gate terminal is disposed at a relative high level, and the source/drain terminal is disposed at a relative low level.

Figure 16:
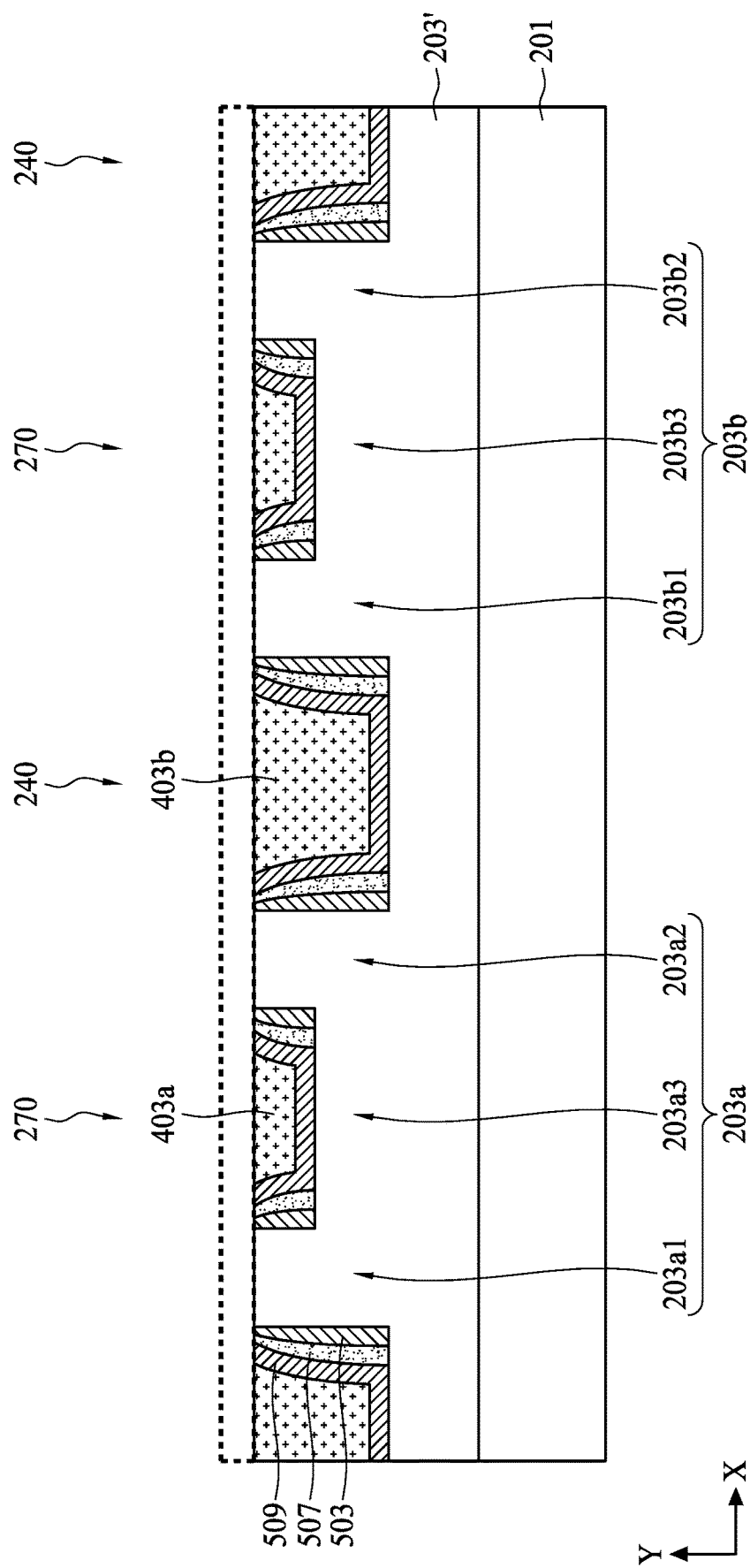
FIG. 16 is a cross-sectional view illustrating an intermediate stage of performing a planarization process over the substrate, in accordance with some embodiments.
Figure 17:
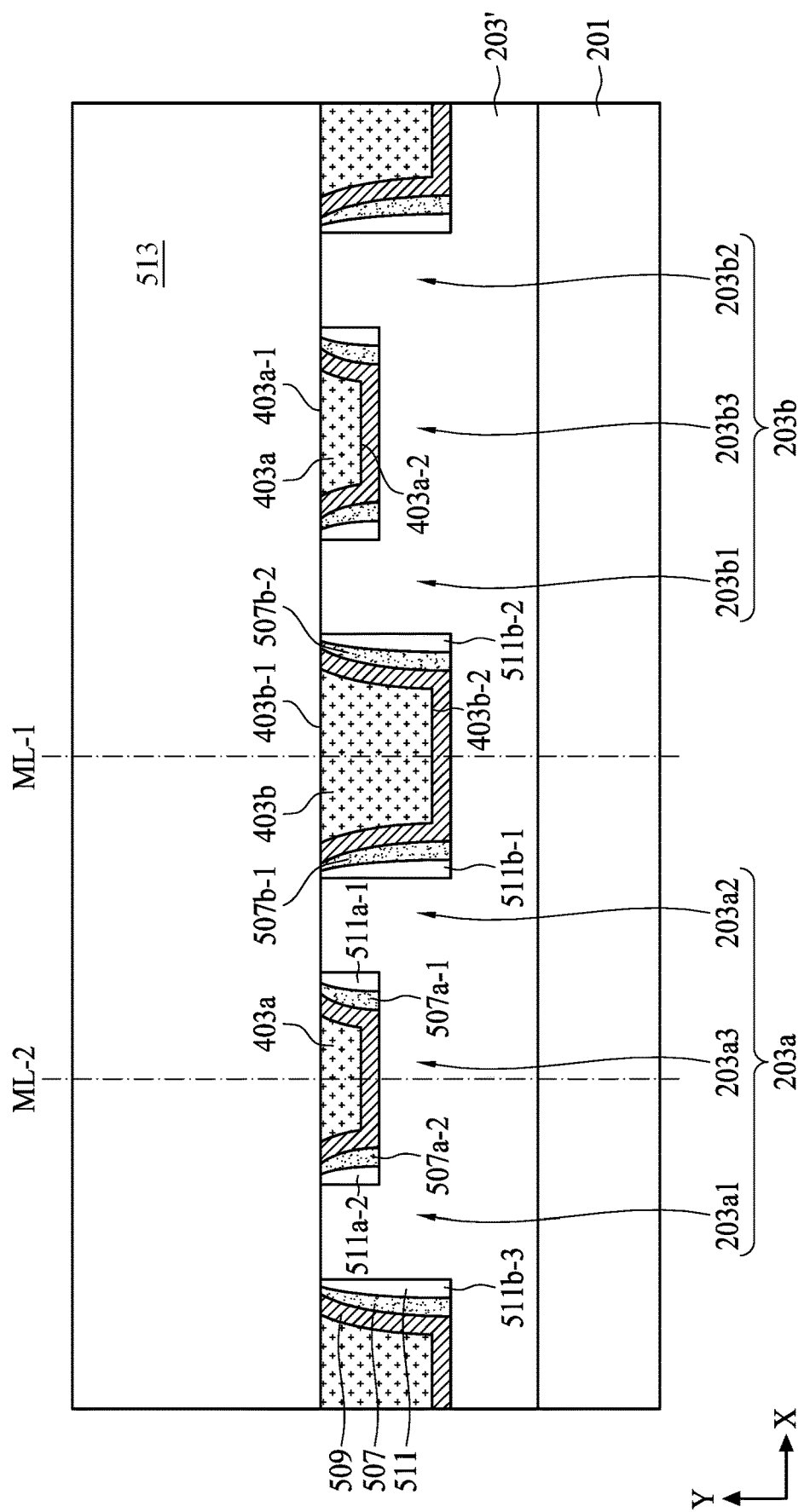
FIG. 17 is a cross-sectional view illustrating an intermediate stage in the formation of a plurality of air gaps over the substrate, in accordance with some embodiments.

Referring to FIGS. 16 and 17, in some embodiments, a plurality of air gaps 511 may be formed above the substrate 101. With reference to FIG. 16, a planarization process, such as chemical mechanical polishing, may be performed to remove part of the liner layer 509 above the target structure 203a (the first portion 203a1 and the second portion 203a2) and the target structure 203b (the fourth portion 203b1 and the fifth portion 203b2). Top surfaces of the plurality of first spacers 503 disposed adjacent to the first portion 203a1 and the second portion 203a2 of the target structure 203a and the fourth portion 203b1 and the fifth portion 203b2 of the target structure 203b may be exposed after the planarization process.

With reference to FIG. 17, the plurality of first spacers 503 disposed adjacent to the first portion 203a1 and the second portion 203a2 of the target structure 203a and the fourth portion 203b1 and the fifth portion 203b2 of the target structure 203b may be removed to form the plurality of air gaps 511. Subsequently, a passivation layer 513 is formed to seal the plurality of air gaps 511. In some embodiments, a vapor hydrogen fluoride may be introduced and may etch the plurality of first spacers 503 disposed adjacent to the first portion 203a1 and the second portion 203a2 of the target structure 203a and the fourth portion 203b1 and the fifth portion 203b2 of the target structure 203b.

In some embodiments, the vapor hydrogen fluoride has a higher etching rate on the plurality of first spacers 503 formed of doped oxide; therefore, the plurality of first spacers 503 disposed adjacent to the first portion 203a1 and the second portion 203a2 of the target structure 203a and the fourth portion 203b1 and the fifth portion 203b2 of the target structure 203b may be selectively removed, while the plurality of second spacers 507 formed of silicon nitride may be selectively retained. The plurality of second spacers 507 may prevent the material of the high-level conductive pattern 403a in the high-level recess 270 and the low-level conductive pattern 403b in the low-level recess 240 from flowing into the plurality of air gaps 511 during subsequent processing steps such as heat treatment.

With reference to FIG. 17, alternatively, in another embodiment, a heat process is applied to remove the plurality of first spacers 503 formed of thermal decomposable polymer or thermal degradable polymer. A temperature of the heat process may be between about 300° C. and about 450° C. In some embodiments, the temperature of the heat process may be between about 350° C. and about 420° C.

Referring to FIG. 17, in some embodiments, the high-level conductive pattern 403a is positioned between the first portion 203a1 and the second portion 203a2. In some embodiments, the low-level conductive pattern 403b has a first top end 403b-1 and first bottom end 403b-2, the high-level conductive pattern 403a has a second top end 403a-1 and second bottom end 403a-2, the first bottom end 403b-2 is lower than the second bottom end 403a-2, and the first top end 403b-1 and the second top end 403a-1 are substantially at the same level. In some embodiments, the bottom ends of the high-level conductive pattern 403a and the low-level conductive pattern 403 are positioned and different level, and there are air gaps between the high-level conductive pattern 403a and the low-level conductive pattern 403. Thus, the parasitic capacitance between the high-level conductive pattern 403a and the low-level conductive pattern 403 can be effectively reduced. That is to say, an interference effect between electrical signals induced or applied to the high-level conductive pattern 403a and the low-level conductive pattern 403 may be remarkably alleviated by the extended distance between the high-level conductive pattern 403a and the low-level conductive pattern 403.

Referring to FIG. 17, in some embodiments, the semiconductor device structure further comprises a first tall air gap 511b-1 between the first target structure 203a and the low-level conductive pattern 403b, and a second tall air gap 511b-2 between the second target structure 203b and the low-level conductive pattern 403b. In some embodiments, the first tall air gap 511b-1 and the second tall air gap 511b-2 have spacer profiles in the cross-sectional view. In some embodiments, the first tall air gap 511b-1 and the second tall air gap 511b-2 are substantially symmetric with respect to a middle line ML-1 between the first target structure 203a and the second target structure 203b.

Referring to FIG. 17, in some embodiments, the semiconductor device structure further comprises a third tall air gap 511b-3, wherein the first tall air gap 511b-1 is positioned on a sidewall of the second portion 203a2, and the third tall air gap 511b-3 is positioned on a sidewall of the first portion 203a1. In some embodiments, the first tall air gap 511b-1 and the third tall air gap 511b-3 are substantially symmetric with respect to a middle line ML-2 between the first portion 203a1 and the second portion 203a2.

Referring to FIG. 17, in some embodiments, the semiconductor device structure further comprises a first tall dielectric spacer 507b-1 positioned between the first tall air gap 511b-1 and the low-level conductive pattern 403b, and a second tall dielectric spacer 507b-2 positioned between the second tall air gap 511b-2 and the low-level conductive pattern 403b. In some embodiments, the first tall dielectric spacer 507b-1 and the second tall dielectric spacer 507b-2 are substantially symmetric with respect to the middle line ML-1 between the first target structure 203a and the second target structure 203b.

Referring to FIG. 17, in some embodiments, the semiconductor device structure further comprises a first short air gap 511a-1 and a first short dielectric spacer 507a-1 positioned between the first tall air gap 511b-1 and the high-level conductive pattern 403a. In some embodiments, the semiconductor device structure comprises the first short air gap 511a-1 and a second short air gap 511a-2 positioned at two sides of the high-level conductive pattern 403a. In some embodiments, the first short air gap 511a-1 and the second short air gap 511a-2 are substantially symmetric with respect to a middle line ML-2 between the first portion 203a1 and the second portion 203a2. In some embodiments, the semiconductor device structure further comprises a second short dielectric spacer 507a-2 positioned between the second short air gap 511a-2 and the high-level conductive pattern 403a Referring to FIG. 17, in some embodiments, the first tall air gap 511b-1 is positioned between the low-level conductive pattern 403b and the second portion 203a2, and the first short air gap 511a-1 is positioned between the high-level conductive pattern 403a and the second portion 203a2. In some embodiments, the tall air gap and the short air gap have spacer profiles in the cross-sectional view. In some embodiments, the first portion 203a1 and the second portion 203a2 are substantially symmetric with respect to the middle line ML-2 between the first portion 203a1 and the second portion 203a2.

FIGS. 18-20 and FIG. 2 are cross-sectional views illustrating sequential intermediate stages in the formation of the semiconductor device structure 200b. The semiconductor device structure 200b is similar to, or the same as, the semiconductor device structure 200a, except that the hard mask structures 205a1, 205a2, 205b1 and 205b2 are not formed between the spacer elements 223a', 223b', 223c', 223d' and the target structures 203a, 203b.

Figure 18:
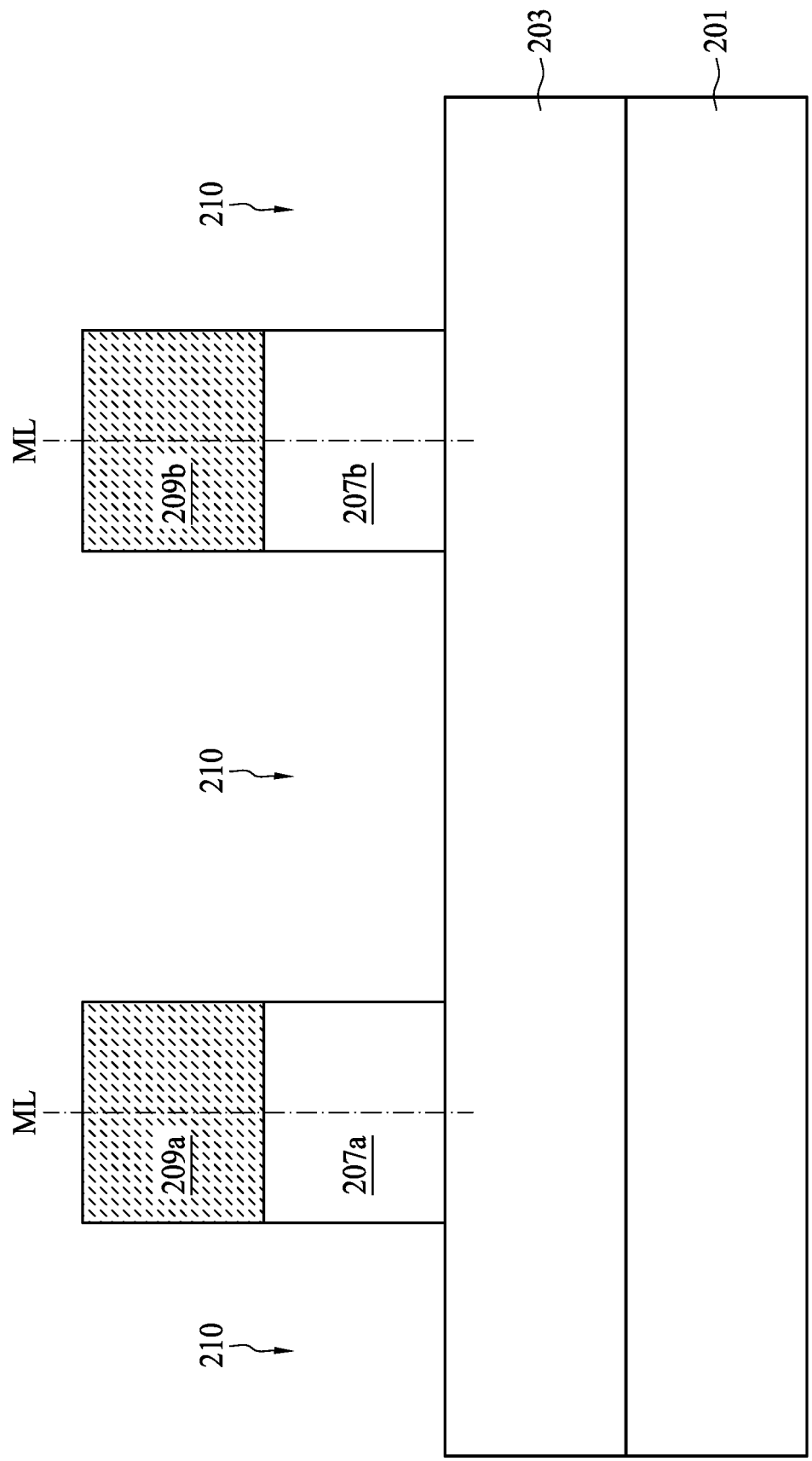
FIG. 18 is a cross-sectional view illustrating an intermediate stage in the formation of hard mask pillars and photoresist patterns over a substrate, in accordance with some embodiments.

As shown in FIG. 18, the target material 203 is disposed over the semiconductor substrate 201, and the hard mask pillars 207a and 207b are disposed over the target material 203 by an etching process using the photoresist patterns 209a and 209b as a mask, in accordance with some embodiments. The respective step is illustrated as the steps S21, S23 and S25 in the method 20 shown in FIG. 4. In some embodiments, compared with the structure shown in FIG. 6, the target material 203 of FIG. 18 is not covered by the hard mask layer 205. More specifically, the hard mask layer 205 is not formed in the structure of FIG. 18, and the target material 203 is exposed by the openings 210, in accordance with some embodiments.

Figure 19:
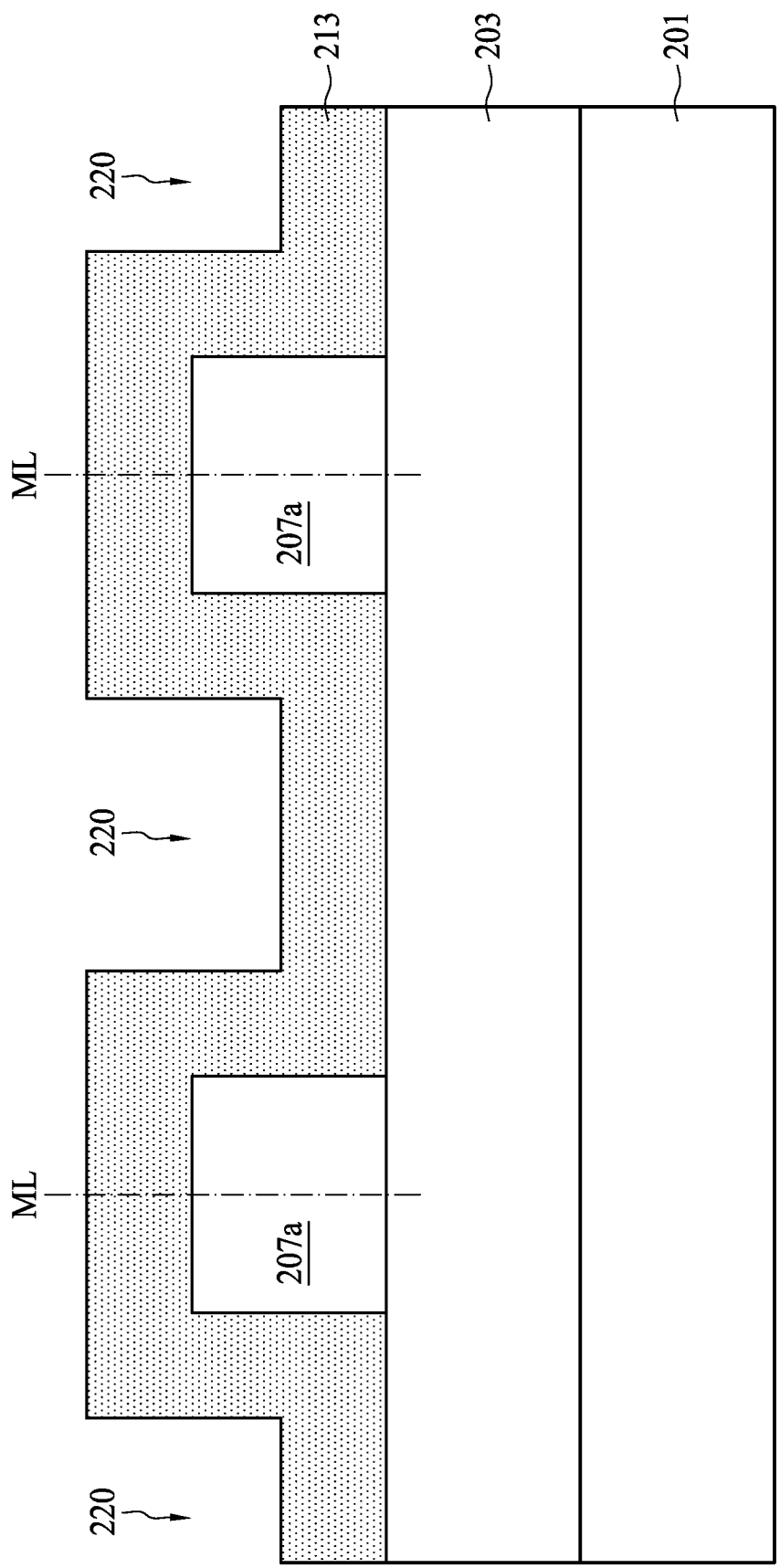
FIG. 19 is a cross-sectional view illustrating an intermediate stage in the formation of a conformal spacer material over the substrate, in accordance with some embodiments.

Next, the photoresist patterns 209a and 209b are removed, and the spacer material 213 is conformally deposited over the top surfaces and the sidewall surfaces of the hard mask pillars 207a, 207b and the top surface of the target material 203, such that reduced openings 220 are obtained, as shown in FIG. 19 in accordance with some embodiments.

Figure 20:
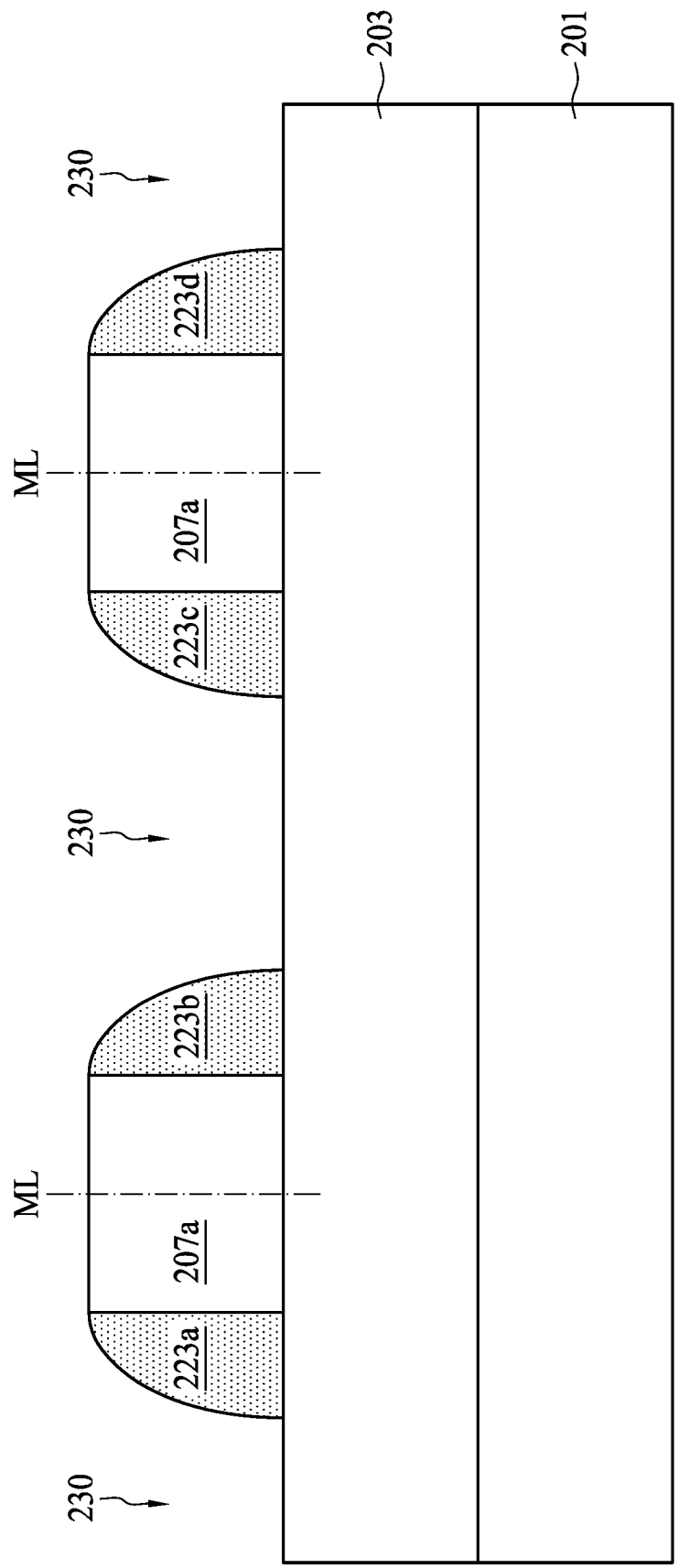
FIG. 20 is a cross-sectional view illustrating an intermediate stage in the formation of a spacer element over the substrate, in accordance with some embodiments.

The spacer material 213 is etched to form spacers 223a, 223b, 223c and 223d over sidewall surfaces of the hard mask pillars 207a, 207b, as shown in FIG. 20 in accordance with some embodiments. The respective steps are illustrated as the step S27 in the method 20 shown in FIG. 4. In some embodiments, compared with the structure shown in FIG. 5, the spacers 223a, 223b, 223c and 223d of FIG. 20 are in direct contact with the target material 203.

Next, the hard mask pillars 207a, 207b and the target material 203 are etched using the spacers 223a, 223b, 223c and 223d as a mask, and the spacers 223a, 223b, 223c and 223d are slightly etched to form spacer elements 223a', 223b', 223c' and 223d', as shown in FIG. 3 in accordance with some embodiments. The respective steps are illustrated as the step S28 in the method 20 shown in FIG. 4.

In some embodiments, the hard mask pillars 207a, 207b are entirely removed, and the target layer 203' and the target structures 203a, 203b over the target layer 203' are formed by etching the target material 203, in accordance with some embodiments. As mentioned above, compared with the semiconductor device structure 200a, the spacer elements 223a', 223b', 223c' and 223d' of the semiconductor device structure 200b are in direct contact with the target structures 203a and 203b, in accordance with some embodiments. In some embodiments, the fabrication processes shown in FIGS. 10-17 may be performed after FIG. 20 to form the high-level conductive pattern 403a and the low-level conductive pattern 403b as shown in FIG. 17.

Figure 5:
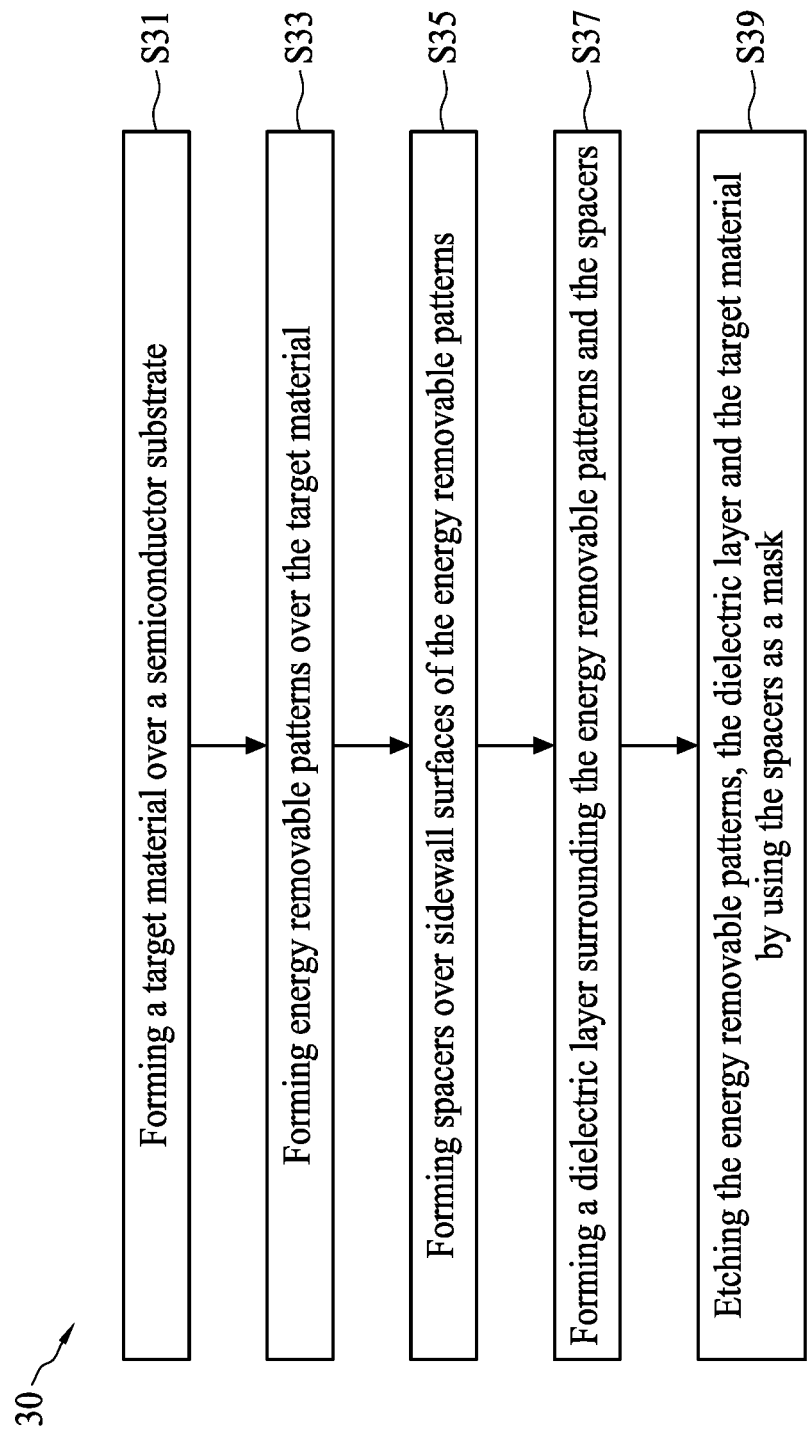
FIG. 5 is a flow diagram illustrating a method of forming a semiconductor device structure, in accordance with some embodiments.

FIG. 5 is a flow diagram illustrating a method 30 of forming the semiconductor device structure 300, wherein the method 30 includes steps S31, S33, S35, S37 and S39, in accordance with some embodiments. The steps S31 to S39 of FIG. 5 are elaborated in connection with FIGS. 21-25, which are cross-sectional views illustrating sequential intermediate stages in the formation of the semiconductor device structure 300, in accordance with some embodiments.

Figure 21:
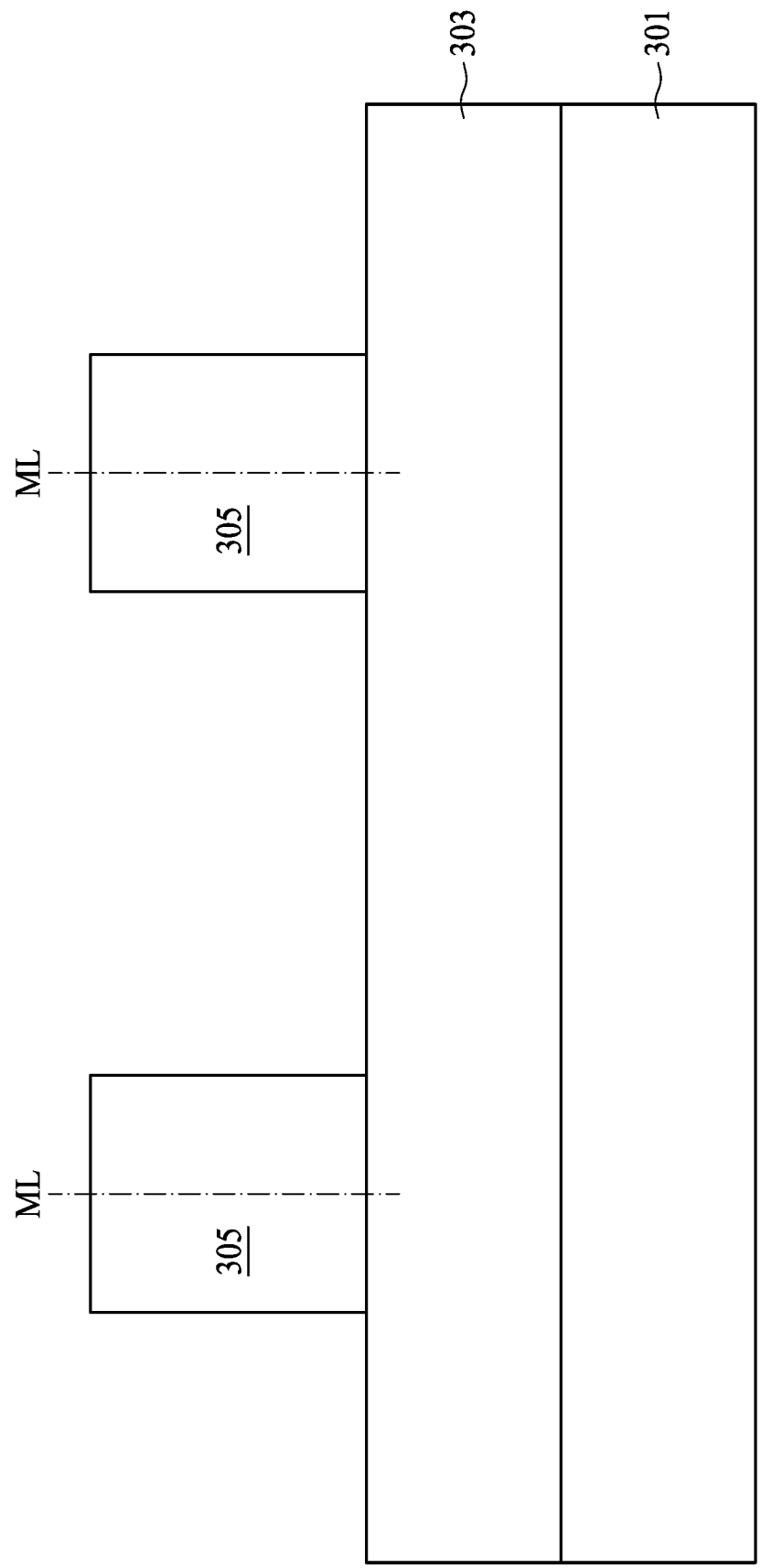
FIG. 21 is a cross-sectional view illustrating an intermediate stage in the formation of an energy removable pattern over a substrate, in accordance with some embodiments.

As shown in FIG. 21, the semiconductor substrate 301 is provided, and a target material 303 is disposed over the semiconductor substrate 301. The details of the semiconductor substrate 301 and the target material 303 may be similar to or the same as the details of the semiconductor substrate 201 and the target material 203, and descriptions thereof are not repeated herein. The respective step is illustrated as the step S31 in the method 30 shown in FIG. 5.

Still referring to FIG. 21, energy removable patterns 305 are disposed over the target material 303, in accordance with some embodiments. The respective step is illustrated as the step S33 in the method 30 shown in FIG. 5. In some embodiments, the energy removable patterns 305 include a thermal decomposable material. In some other embodiments, the energy removable patterns 305 include a photonic decomposable material, an e-beam decomposable material, or another applicable energy decomposable material. Specifically, in some embodiments, the energy removable patterns 305 include a base material and a decomposable porogen material that is substantially removed upon exposure to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can, in the subsequent processes, provide porosity to the space originally occupied by the energy removable patterns 305.

In some embodiments, the energy removable patterns 305 are formed by a deposition process and a patterning process. The deposition process may be CVD, PVD, ALD, spin coating, or another suitable process, and the patterning process for forming the energy removable patterns 305 may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

In some embodiments, the target material 203 includes a thermal decomposable material, a photonic decomposable material, an e-beam decomposable material, or another applicable energy decomposable material. It should be noted that the target material 203 and the energy removable patterns 305 include the same material, or the similar material, in accordance with some embodiments.

Figure 22:
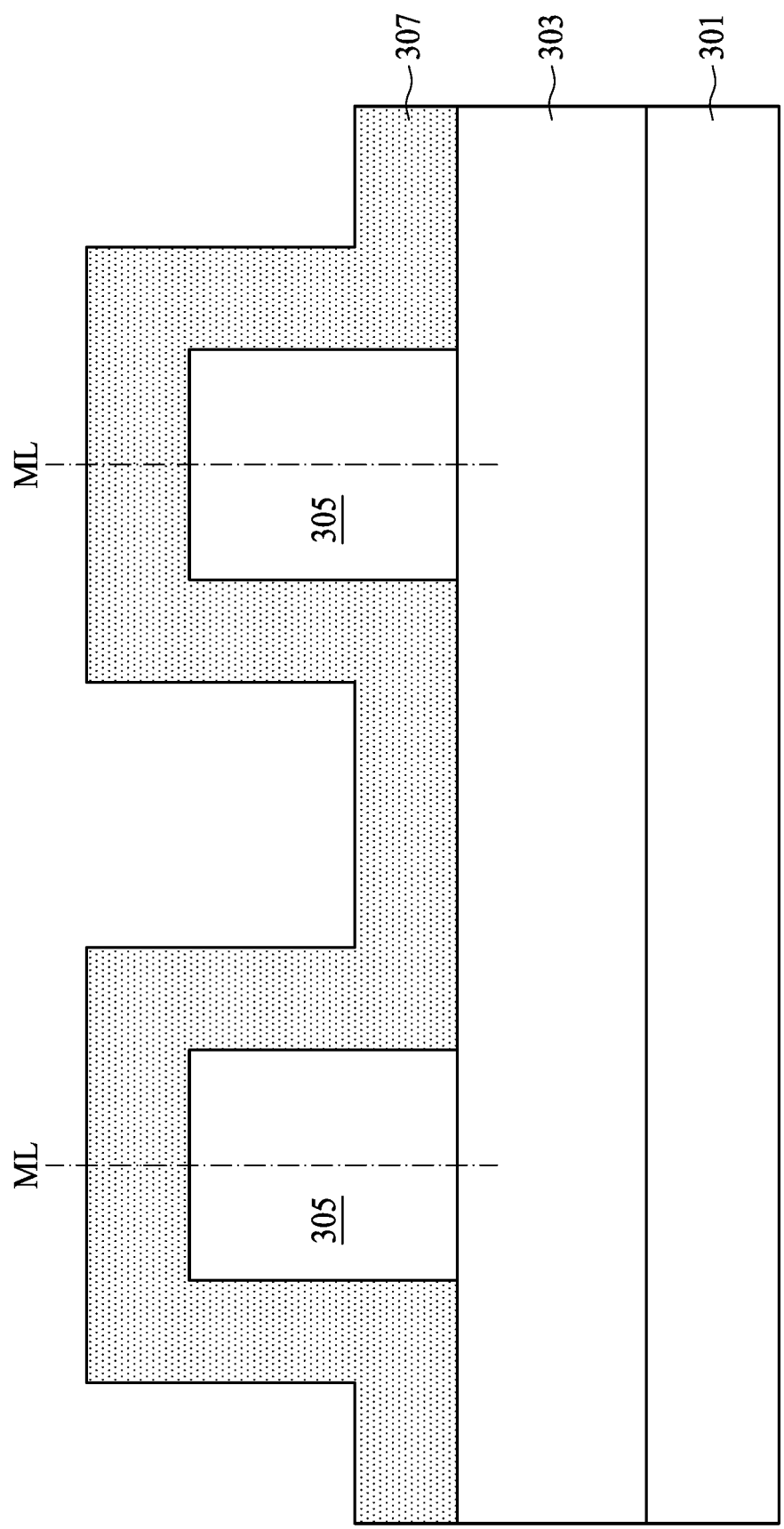
FIG. 22 is a cross-sectional view illustrating an intermediate stage in the formation of a conformal spacer material over the energy removable patterns, in accordance with some embodiments.

After the energy removable patterns 305 are formed, a spacer material 307 is conformally deposited over the top surfaces and the sidewall surfaces of the energy removable patterns 305 and the top surface of the target material 303, as shown in FIG. 22 in accordance with some embodiments.

In some embodiments, the spacer material 307 is made of silicon oxide, silicon carbide, silicon nitride, silicon oxynitride, another suitable material, or a combination thereof, and the deposition process for forming the spacer material 307 includes CVD, PVD, ALD, spin coating, or another suitable process. In some embodiments, the material of the spacer material 307 is different from the material of the energy removable patterns 305. It should be noted that the material of the energy removable patterns 305 has a high etching selectivity against the material of the spacer material 307.

Figure 23:
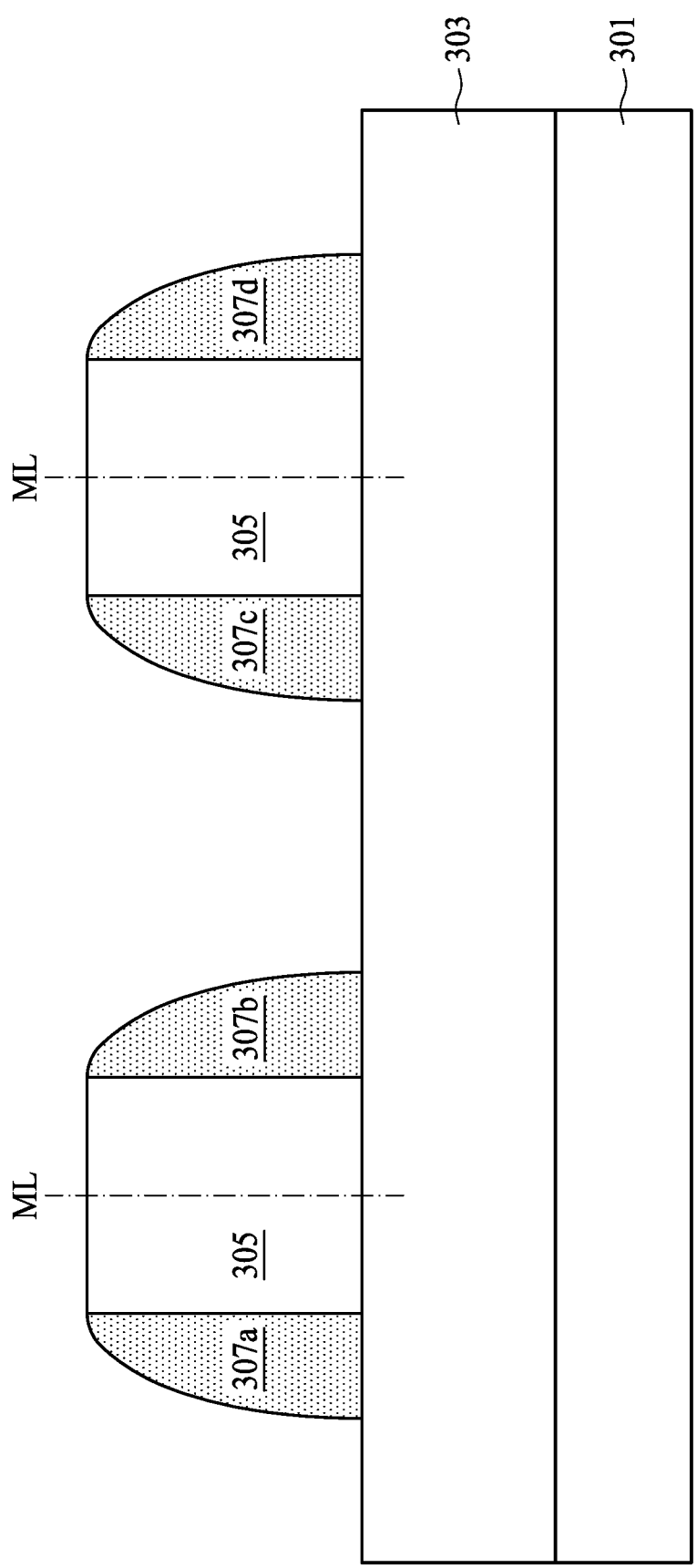
FIG. 23 is a cross-sectional view illustrating an intermediate stage in the formation of a spacer element over the substrate, in accordance with some embodiments.

Next, the spacer material 307 is etched to form spacers 307a, 307b, 307c and 307d over sidewall surfaces of the energy removable patterns 305, as shown in FIG. 23 in accordance with some embodiments. The respective steps are illustrated as the step S35 in the method 30 shown in FIG. 5. In some embodiments, the etching process is an anisotropic etching process, which removes the same amount of the spacer material 307 vertically in all places, leaving the spacers 307a, 307b, 307c and 307d over the sidewall surfaces of the energy removable patterns 305. In some embodiments, the etching process is a dry etching process.

Figure 24:
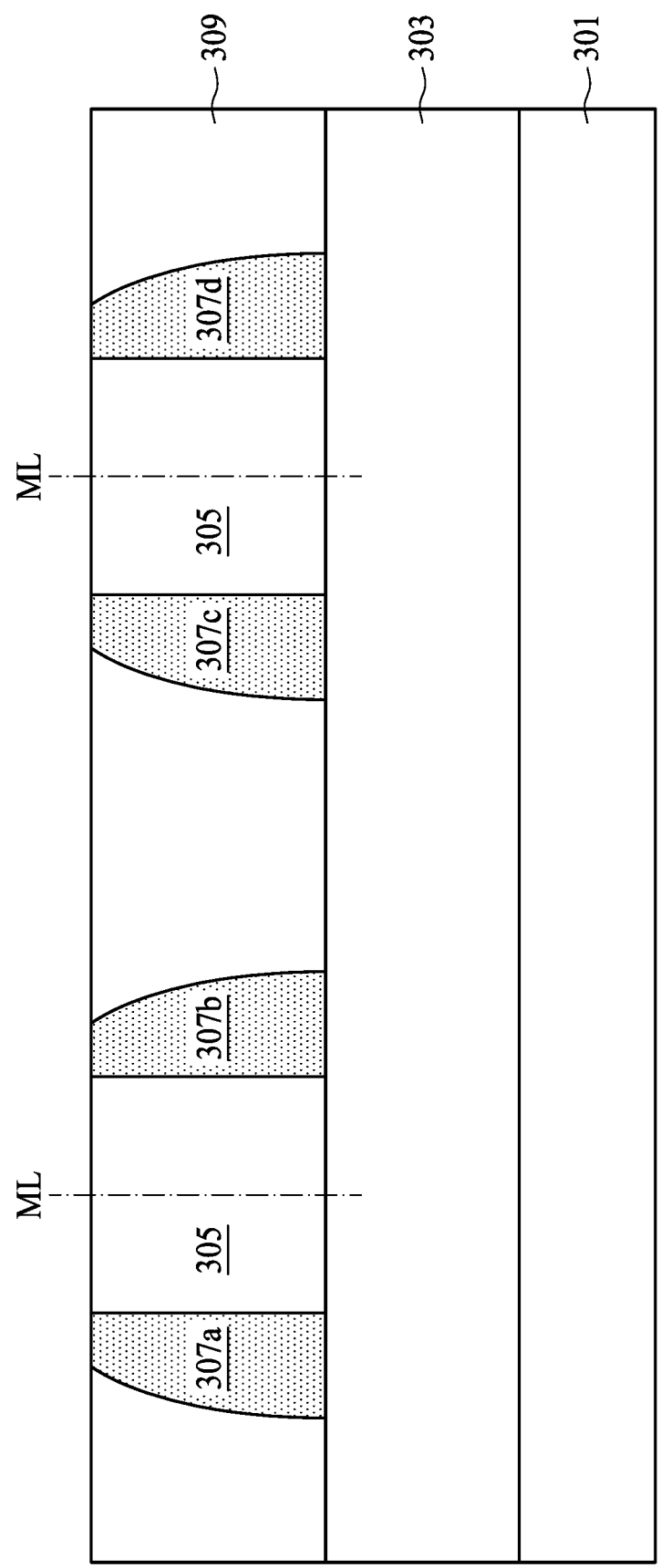
FIG. 24 is a cross-sectional view illustrating an intermediate stage in the formation of a dielectric layer surrounding the energy removable patterns and the spacers over semiconductor device structure, in accordance with some embodiments.

After the spacers 307a, 307b, 307c and 307d are formed, a dielectric layer 309 is formed surrounding the energy removable patterns 305 and the spacers 307a, 307b, 307c and 307d, as shown in FIG. 24 in accordance with some embodiments. The respective steps are illustrated as the step S37 in the method 30 shown in FIG. 5.

In some embodiments, the dielectric layer 309 includes silicon oxide, silicon carbide, silicon nitride, silicon oxynitride, one or more suitable dielectric materials, or a combination thereof. In some embodiments, the material of the dielectric layer 309 is different from the material of the spacers 307a, 307b, 307c and 307d. It should be noted that the material of the dielectric layer 309 has a high etching selectivity against the material of the spacers 307a, 307b, 307c and 307d.

In some embodiments, the dielectric layer 309 includes a thermal decomposable material, a photonic decomposable material, an e-beam decomposable material, or another applicable energy decomposable material. It should be noted that the dielectric layer 309 and the energy removable patterns 305 include the same material, or the similar material, in accordance with some embodiments.

In some embodiments, the dielectric layer 309 is formed by a deposition process and a subsequent planarization process. The deposition process may be CVD, PVD, ALD, spin coating, or another applicable process, and the planarization process may be a chemical mechanical polishing (CMP) process.

Figure 25:
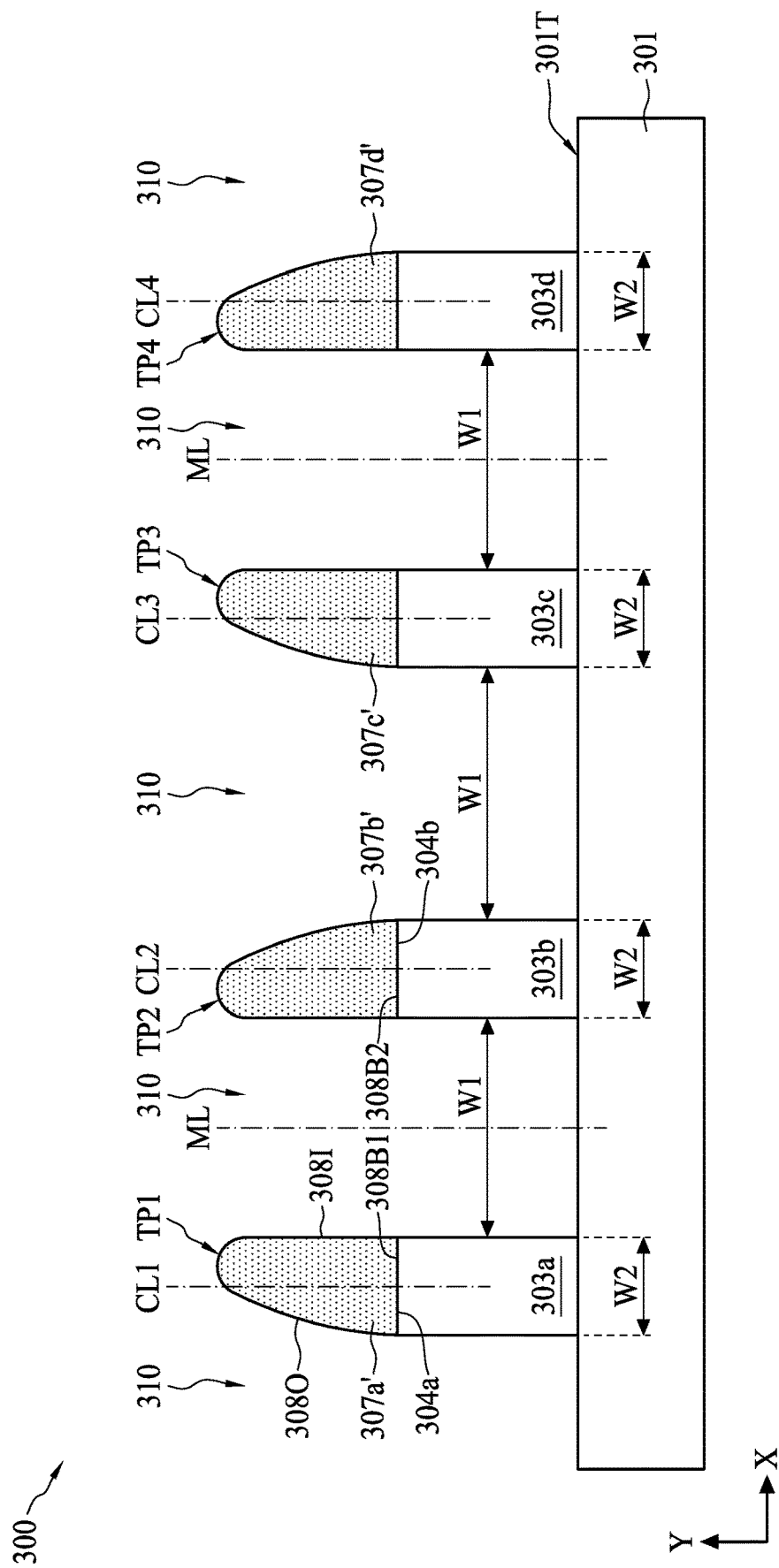
FIG. 25 is a cross-sectional view illustrating the formation of a semiconductor device structure after etching the energy removable patterns, the dielectric layer and the target material by using the spacers as an etching mask, in accordance with some embodiments.

Next, the energy removable patterns 305, the dielectric layer 309 and the target material 303 are etched by using the spacer elements 307a, 307b, 307c and 307d as an etching mask, as shown in FIG. 25 in accordance with some embodiments. The respective steps are illustrated as the step S39 in the method 30 shown in FIG. 5. In some embodiments, the etching process is a dry etching process. In some embodiments, referring to FIG. 25, the spacer element 307a' and the spacer element 307b' are substantially symmetric with respect to a middle line ML between the spacer element 307a' and the spacer element 307b'.

In some embodiments, referring to FIG. 25, the spacer element 307a' and the spacer element 307b' has a rounding top surfaces at the topmost point TP1 and the topmost point TP2, respectively, in the cross-sectional view. In some embodiments, referring to FIG. 25, the spacer element 307a' has an inner surface 308I and an outer surface 308O, the inner surface 308I faces the central line ML in the cross-sectional view, the outer surface 308O faces the opposite side, the inner surface 308I is substantially a non-curved surface, the outer surface 308O is substantially a curved surface, and the curvature of the inner surface 308I is smaller than that of the outer surface 308O.

In some embodiments, referring to FIG. 25, the target structure 303a has a top surface with a first top width 304a, the spacer element 307a' has bottom surface 308B1 with a first bottom width, the top surface 304a contacts the bottom surface 308B1, and the first top width is substantially the same as the first bottom width. In some embodiments, referring to FIG. 25, the target structure 303b has a top surface 304b with a second top width, the spacer element 307b' has bottom surface 308B2 with a second bottom width, the top surface 304b contacts the bottom surface 308B2, and the second top width is substantially the same as the second bottom width.

In some embodiments, referring to FIG. 25, the openings 310 have the same width W1, and the target structures 303a, 303b, 303c and 303d have the same width W2. In some embodiments, the width W1 is designed to be the same as the width W2, i.e., equal spaces and patterns. In some embodiments, the semiconductor device structure 300 includes a film structure (not shown in the drawings) over the semiconductor substrate 301. In some embodiments, the target structures 303a, 303b, 303c and 303d are formed over the film structure, serving as fine patterns, which can be used as a hard mask in the subsequent fabrication process for patterning corresponding fine patterns in the film structure. In some embodiments, the fabrication processes shown in FIGS. 10-17 may be performed after FIG. 20 to form the high-level conductive pattern 403a and the low-level conductive pattern 403b as shown in FIG. 17.

In some embodiments, the energy removable patterns 305 are entirely removed, and the target structures 303a, 303b, 303c and 303d are formed by etching through the target material 303, in accordance with some embodiments. In addition, the spacers 307a, 307b, 307c and 307d are slightly etched to form spacer elements 307a', 307b', 307c' and 307d'. It should be noted that the material of the energy removable patterns 305 has a high etching selectivity against the material of the spacers 307a, 307b, 307c and 307d (i.e., the material of the spacer elements 307a', 307b', 307c' and 307d') during the etching process.

The material of the energy removable patterns 305 has a first etching selectivity against the material of the spacers 307a, 307b, 307c, 307d, the material of the dielectric layer 309 has a second etching selectivity against the material of the spacers 307a, 307b, 307c, 307d, and the material of the target material 303 has a third etching selectivity against the material of the spacers 307a, 307b, 307c, 307d. In some embodiments, the first etching selectivity, the second etching selectivity and the third etching selectivity are similar to each other.

Since the energy removable patterns 305, the dielectric layer 309 and the target material 303 have a high etching selectivity against the spacers 307a, 307b, 307c, 307d in the etching process for forming the spacer elements 307a', 307b', 307c', 307d', the etching process may be performed all the way down to the top surface 301T of the semiconductor substrate 301 while avoiding the collapse of the spacer elements 307a', 307b', 307c' and 307d'.

In one embodiment of the present disclosure, a semiconductor device structure is provided. The semiconductor device structure comprises: a substrate; a first target structure disposed over the substrate, wherein the first target structure comprises a first portion, a second portion, and a third portion connected to the first portion and the second portion, a height of the first portion and a height of the second portion are greater than a height of the third portion;

a second target structure disposed over the target layer, wherein the second target structure comprises a fourth portion, a fifth portion, and a sixth portion connected to the fourth portion and the fifth portion; a low-level conductive pattern positioned between the first target structure and the second target structure; and a high-level conductive pattern positioned in the first target structure.

In another embodiment of the present disclosure, a method for preparing a semiconductor device structure is provided. The method comprises: forming a hard mask material over a substrate; etching the hard mask material to form hard mask pillars; forming spacers over sidewall surfaces of the hard mask pillars; etching the hard mask pillars and the target material by using the spacers as a mask to integrally forming a plurality of target structures, a high-level recesses in one of the plurality of target structures and a low-level recess between two target structures; and integrally forming a high-level conductive pattern in the high-level conductive pattern and a low-level conductive pattern in the low-level recess.

Embodiments of a semiconductor device structure and methods for preparing the same are provided. The method for preparing the semiconductor device structure may include undercutting a photoresist pattern over a semiconductor substrate, and forming an inner spacer element over a sidewall surface of the photoresist pattern. The inner spacer element has a portion extending into a recess (i.e., the undercut region) of the photoresist pattern to form a footing, and a width of the portion of the inner spacer element increases continuously as the portion extends toward the semiconductor substrate. As a result, the inner spacer element may be prevented from collapsing after removal of the photoresist pattern.

In addition, the bottom ends of the high-level conductive pattern and the low-level conductive pattern are positioned and different level, and there are air gaps between the high-level conductive pattern and the low-level conductive pattern. Thus, the parasitic capacitance between the high-level conductive pattern and the low-level conductive pattern can be effectively reduced. That is to say, an interference effect between electrical signals induced or applied to the high-level conductive pattern and the low-level conductive pattern may be remarkably alleviated by the extended distance between the high-level conductive pattern and the low-level conductive pattern.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising the steps of:
    forming a first target structure and a second target structure over a substrate, wherein the first target structure has a first portion, a second portion, and a third portion connected to the first portion and the second portion, wherein a height of the first portion and a height of the second portion are greater than a height of the third portion;
    forming a low-level conductive pattern between the first target structure and the second target structure;
    forming a high-level conductive pattern on the first target structure;
    forming a first tall air gap between the first target structure and the low-level conductive pattern at a position that the first tall air gap is positioned on a sidewall of the second portion of the first target structure;
    forming a second tall air gap between the second target structure and the low-level conductive pattern, wherein the first tall air gap and the second tall air gap have a thickness substantially identical to a thickness of the low-level conductive pattern; and
    forming a third tall air gap at a position that the third tall air gap is positioned on a sidewall of the first portion of the first target structure.

2. The method of claim 1, further comprising the steps of:
    forming a hard mask material over the substrate;
    etching the hard mask material to form hard mask pillars;
    etching the hard mask pillars and the target material to integrally form the first and second target structures, a high-level recess in the first target structure and a low-level recess between the first and second target structures; and
    integrally forming the high-level conductive pattern in the high-level recess and the low-level conductive pattern in the low-level recess.

3. The method of claim 1, further comprising a step of forming a short air gap between the high-level conductive pattern and the second portion of the first target structure.

4. The method of claim 3, wherein the tall air gap and the short air gap have spacer profiles in a cross-sectional view.

5. The method of claim 3, further comprising the steps of:
    forming a first tall dielectric spacer between the tall air gap and the low-level conductive pattern; and
    forming a second tall dielectric spacer between the short air gap and the high-level conductive pattern.

6. The method of claim 1, further comprising the steps of:
    forming a tall dielectric spacer between the low-level conductive pattern and the second portion of the first target structure; and
    forming a short dielectric spacer between the high-level conductive pattern and the second portion of the first target structure.

7. The method of claim 1, wherein the low-level conductive pattern has a first top end and first bottom end, the high-level conductive pattern has a second top end and second bottom end, the first bottom end is lower than the second bottom end, and the first top end and the second top end are substantially at the same level.

8. The method of claim 1, wherein the first tall air gap and the second tall air gap are substantially symmetric with respect to a middle line between the first target structure and the second target structure.

9. The method of claim 1, wherein the first tall air gap and the third tall air gap are substantially symmetric with respect to a middle line between the first portion and the second portion of the first target structure.

10. The method of claim 1, wherein the first portion and the second portion are substantially symmetric with respect to a middle line between the first portion and the second portion.

11. The method of claim 1, wherein the high-level conductive pattern is positioned between the first portion and the second portion.

* * * * *